US012727494B2

(12) United States Patent
Nam et al.

(10) Patent No.: US 12,727,494 B2
(45) Date of Patent: Sep. 1, 2026

(54) SEMICONDUCTOR PACKAGE INCLUDING INTERPOSER

(71) Applicant: SAMSUNG ELECTRONICS CO., LTD., Suwon-si (KR)

(72) Inventors: Soohyun Nam, Hwaseong-si (KR); Haejung Yu, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 626 days.

(21) Appl. No.: 18/054,225

(22) Filed: Nov. 10, 2022

(65) Prior Publication Data

US 2023/0178469 A1 Jun. 8, 2023

(30) Foreign Application Priority Data

Dec. 2, 2021 (KR) ........................ 10-2021-0171200

(51) Int. Cl.
*H10W 70/65* (2026.01)
*H10W 70/685* (2026.01)
(Continued)

(52) U.S. Cl.
CPC ......... *H10W 70/65* (2026.01); *H10W 70/685* (2026.01); *H10W 74/121* (2026.01); *H10W 90/00* (2026.01); *H10W 90/401* (2026.01); *H10W 90/701* (2026.01); *H10W 74/00* (2026.01); *H10W 74/15* (2026.01); *H10W 90/722* (2026.01); *H10W 90/724* (2026.01);
(Continued)

(58) Field of Classification Search
CPC ........... H01L 23/49838; H01L 23/3135; H01L 23/49816; H10W 70/65; H10W 70/685; H10W 74/121
See application file for complete search history.

(56) References Cited

U.S. PATENT DOCUMENTS 9,589,945 B2 3/2017 Jo et al.
9,865,567 B1 1/2018 Chaware et al.
(Continued)

FOREIGN PATENT DOCUMENTS

KR 101498649 B1 3/2015
KR 10-2018-0054440 A 5/2018
(Continued)

OTHER PUBLICATIONS

1 "Office Action", Taiwanese Application No. 111145233, Sep. 9, 2024, 3 pp.

*Primary Examiner* — Errol V Fernandes
(74) *Attorney, Agent, or Firm* — Wolf, Greenfield & Sacks, P.C.

(57) ABSTRACT

A semiconductor package includes an interposer including a base layer and a plurality of interposer through-electrodes penetrating the base layer; at least one stacked structure attached to the interposer and including a first semiconductor chip, a plurality of second semiconductor chips sequentially stacked on the first semiconductor chip, and a chip molding layer on a side surface of the plurality of second semiconductor chips; a plurality of third semiconductor chips attached to the interposer adjacent the at least one stacked structure; and a package molding layer extending around the at least one stacked structure and the plurality of third semiconductor chips on the interposer.

20 Claims, 21 Drawing Sheets

(51) Int. Cl.

| | |
|---|---|
| ***H10W 74/10*** | (2026.01) |
| ***H10W 90/00*** | (2026.01) |
| *H10W 74/00* | (2026.01) |
| *H10W 74/15* | (2026.01) |

(52) U.S. Cl.

CPC ........ *H10W 90/732* (2026.01); *H10W 90/734* (2026.01)

(56) References Cited

U.S. PATENT DOCUMENTS

| | | | |
|---|---|---|---|
| 10,043,769 | B2 | 8/2018 | Shih et al. |
| 10,153,222 | B2 | 12/2018 | Yu et al. |
| 10,672,712 | B2 | 6/2020 | Bhagavat et al. |
| 10,700,046 | B2 | 6/2020 | Rickard et al. |
| 11,594,471 | B2 | 2/2023 | Son et al. |
| 2018/0138101 | A1* | 5/2018 | Yu ......................... H01L 23/562 |
| 2021/0098420 | A1 | 4/2021 | Chen et al. |
| 2021/0143126 | A1 | 5/2021 | Choi et al. |

FOREIGN PATENT DOCUMENTS

| | | | |
|---|---|---|---|
| KR | 20200117823 | A | 10/2020 |
| KR | 10-2021-0038963 | A | 4/2021 |
| KR | 10-2021-0057853 | A | 5/2021 |
| TW | 202236561 | A | 9/2022 |

* cited by examiner 1000
1
180
400(400M-1)
402
410
420
450
480
360
364
366
362
300
522
530
524
500
IIA'
510
550
610
620
350
320
200
(200H)
100
700
750
310
330
IIA
Z
X
Y

Figure 2B:
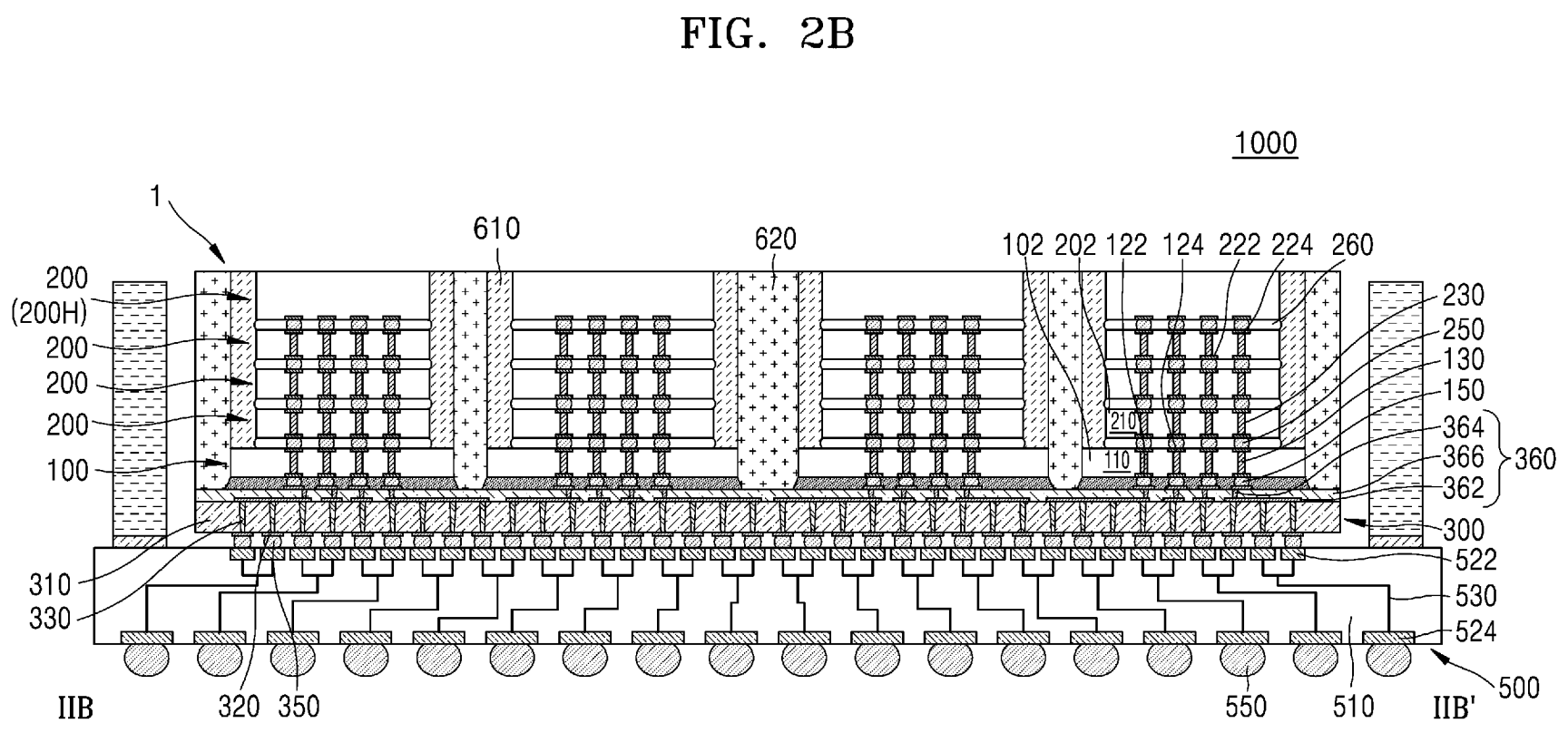

230 250 130 150 364 366 362 300 522 530 524 500 360 260 224 222 124 122 202 102 210 110 510 550 620 610 350 320 1 200 (200H) 200 200 200 100 310 330 IIB IIB'

1000
400
400CP
400M-1
400M-2
400D
402
410
420
450
480
620
700
750
522
530
524
500
510
550
IIC'
IIC
350
320
360
364
366
362
300
310
330

FIG. 12

SEMICONDUCTOR PACKAGE INCLUDING INTERPOSER

CROSS-REFERENCE TO RELATED APPLICATION

This application is based on and claims priority under 35 U.S.C. § 119 to Korean Patent Application No. 10-2021-0171200, filed on Dec. 2, 2021, in the Korean Intellectual Property Office, the disclosure of which is incorporated by reference herein in its entirety.

BACKGROUND

The present inventive concept relates to semiconductor packages, and methods of manufacturing semiconductor packages.

There is increased demand for semiconductor devices with enhanced functionality. In order to meet performance and price requirements of consumers, the degree of integration and miniaturization of semiconductor elements has increased. This increase in integration and miniaturization has increased the demand for semiconductor packages that can implement systems having high memory bandwidth. Because memory bandwidth may be proportional to data transmission speed and the number of data transmission lines, it may be possible to increase memory bandwidth by increasing memory operation speed or by increasing the number of data transmission lines.

SUMMARY

The present inventive concept provides an interposer having structural reliability and connection reliability, and semiconductor packages including the interposer.

According to an aspect of the present inventive concept, there is provided a semiconductor package. The semiconductor package according to the present inventive concept includes: an interposer including a base layer and a plurality of through-electrodes penetrating the base layer; at least one stacked structure attached to the interposer, the at least one stacked structure including a first semiconductor chip, a plurality of second semiconductor chips sequentially stacked on the first semiconductor chip, and a chip molding layer on a side surface of the plurality of second semiconductor chips; a plurality of third semiconductor chips attached to the interposer adjacent the at least one stacked structure; and a package molding layer extending around the at least one stacked structure and the plurality of third semiconductor chips, wherein the plurality of third semiconductor chips include a first chip group and a second chip group, and the at least one stacked structure is between the first chip group and the second chip group.

The semiconductor package according to the present inventive concept includes: an interposer including a base layer and a plurality of through-electrodes penetrating the base layer, the base layer includes silicon, and the interposer includes a pair of first edges opposite to each other in a first direction and a pair of second edges opposite to each other in a second direction orthogonal to the first direction; a stacked structure group attached to the interposer, the stacked structure group including a plurality of stacked structures, each stacked structure including a first semiconductor chip, a plurality of second semiconductor chips sequentially stacked on the first semiconductor chip, and a chip molding layer on a side surface of the plurality of second semiconductor chips; a plurality of third semiconductor chips attached to the interposer adjacent the stacked structure group; and a package molding layer on the interposer, the package molding layer extending around the stacked structure group and the plurality of third semiconductor chips to form a molding interface with the chip molding layer, wherein the plurality of third semiconductor chips include a first chip arranged in a row along one of the first edges, and a second chip group arranged in a row along the other one of the first edges, and wherein the stacked structure group is spaced apart from each of the first edges.

The semiconductor package according to the present inventive concept includes: a package base substrate; a silicon interposer attached to the package base substrate, the silicon interposer including a base layer and a plurality of through-electrodes penetrating the base layer, and having a pair of first edges opposite to each other in a first direction and a pair of second edges opposite to each other in a second direction orthogonal to the first direction; a stacked structure group attached to the silicon interposer, the stacked structure group including a plurality of stacked structures, each stacked structure including a first semiconductor chip including a first semiconductor substrate and a plurality of first through-electrodes penetrating the first semiconductor substrate, a plurality of second semiconductor chips sequentially stacked on the first semiconductor chip and including a second semiconductor substrate and a plurality of second through-electrodes penetrating the second semiconductor substrate and electrically connected to the plurality of first through-electrodes, and a chip molding layer on an upper surface of the first semiconductor chip and a side surface of the plurality of second semiconductor chips; a plurality of third semiconductor chips attached to the silicon interposer adjacent the stacked structure group; and a package molding layer on the silicon interposer, the package molding layer extending around the stacked structure group and the plurality of third semiconductor chips to form a molding interface with the chip molding layer, wherein the plurality of third semiconductor chips include a first chip group arranged in a row along one of the first edges, and a second chip group arranged in a row along the other one of the first edges, and wherein the stacked structure group is spaced apart from each of the first edges, the chip molding layer has a first thickness in the second direction from a side surface of the plurality of second semiconductor chips, and the package molding layer has a second thickness in the second direction that is at least twice greater than the first thickness, and a side surface of the stacked structure group adjacent to one of the second edges is not closer to the one of the second edges than a side surface of the third semiconductor chip adjacent to the one of the second edges.

BRIEF DESCRIPTION OF THE DRAWINGS

Embodiments of the present inventive concept will be more clearly understood from the following detailed description taken in conjunction with the accompanying drawings in which:

FIGS. 2A to 2C are cross-sectional views of a semiconductor package according to some embodiments;

FIG. 12 is a cross-sectional view of a semiconductor package according to some embodiments.

DETAILED DESCRIPTION OF THE EMBODIMENTS

Figure 1:
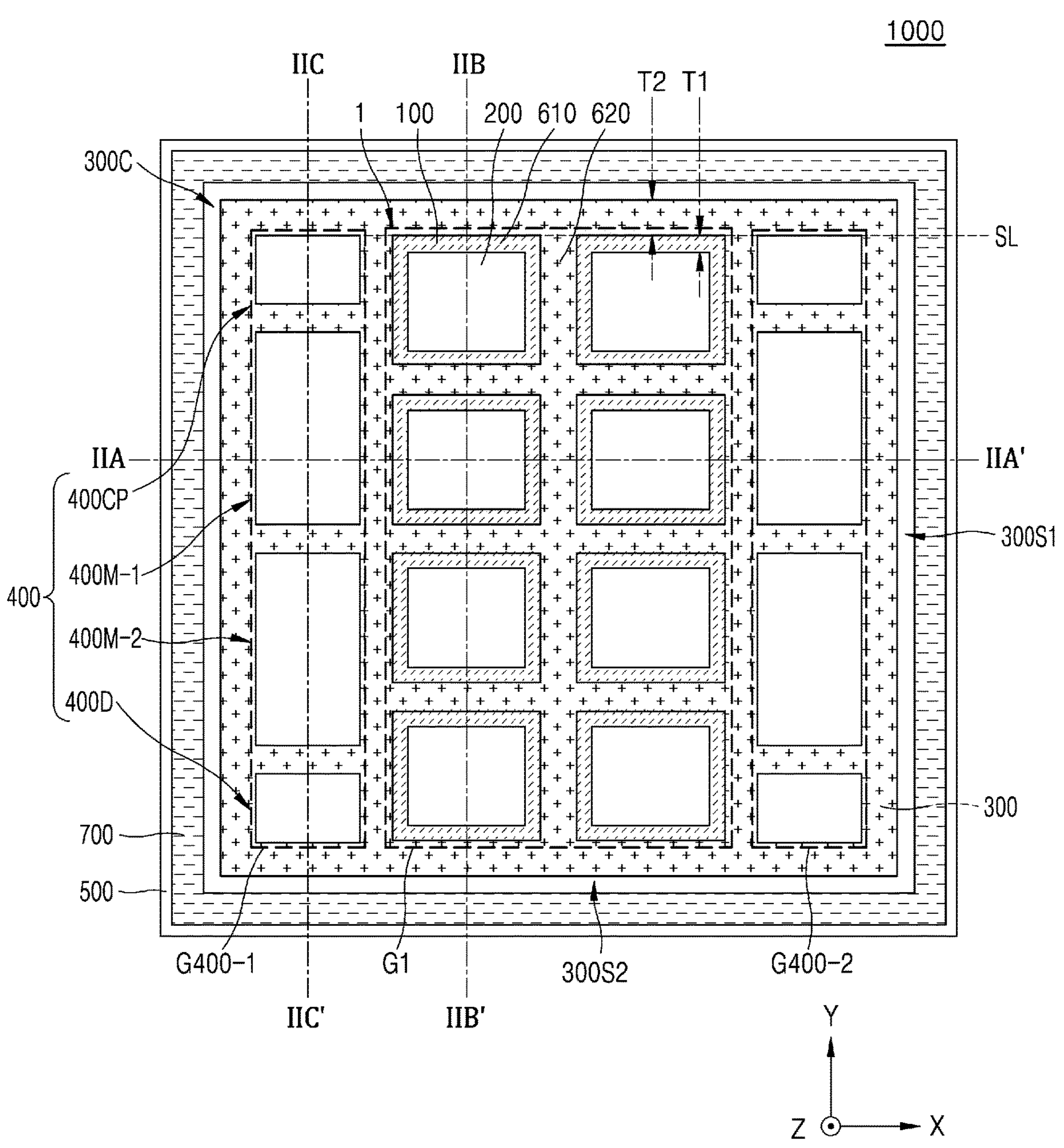
FIG. 1 is a plan view of a semiconductor package according to some embodiments.
Figure 2A:
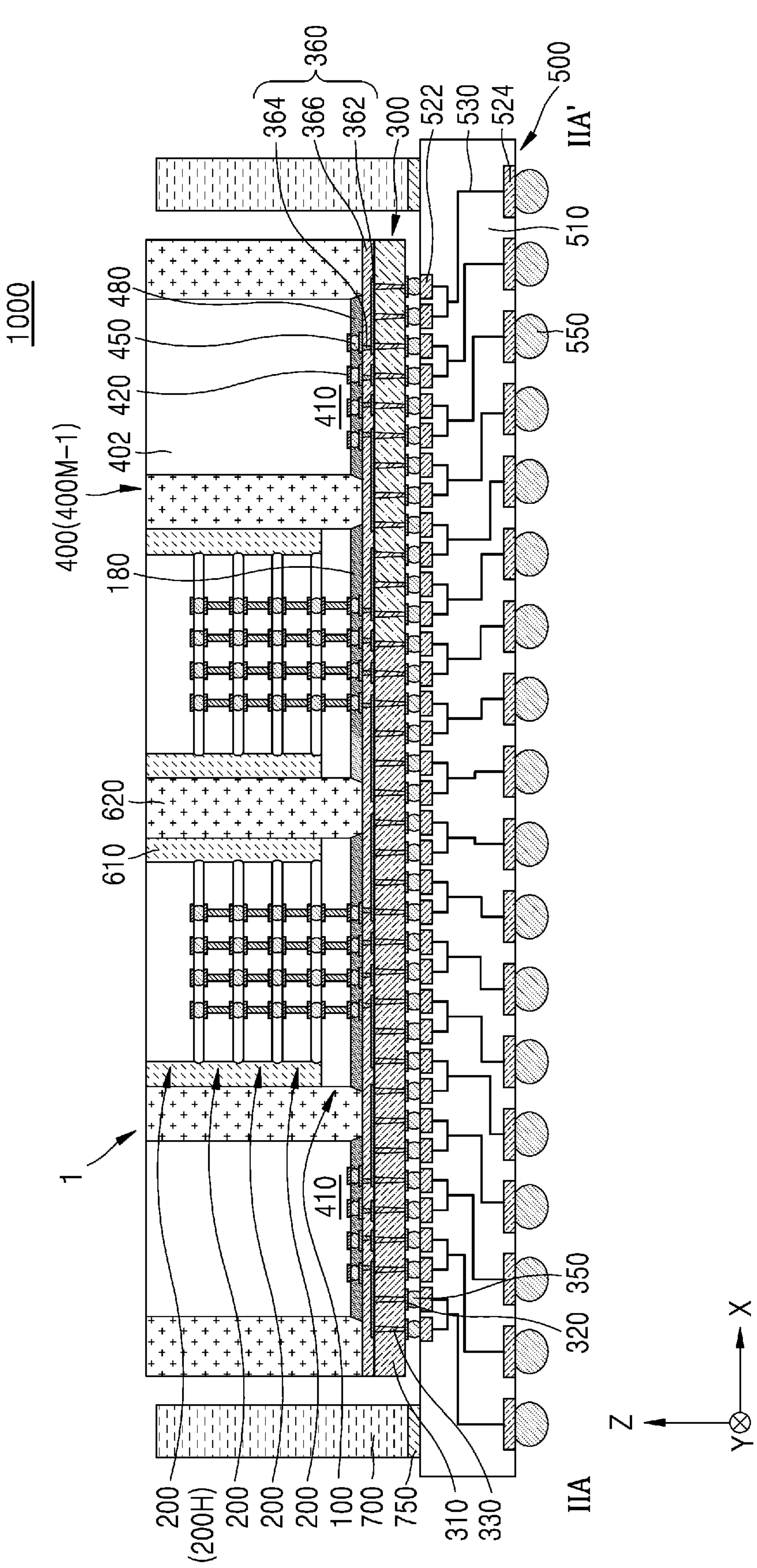
Figure 2C:
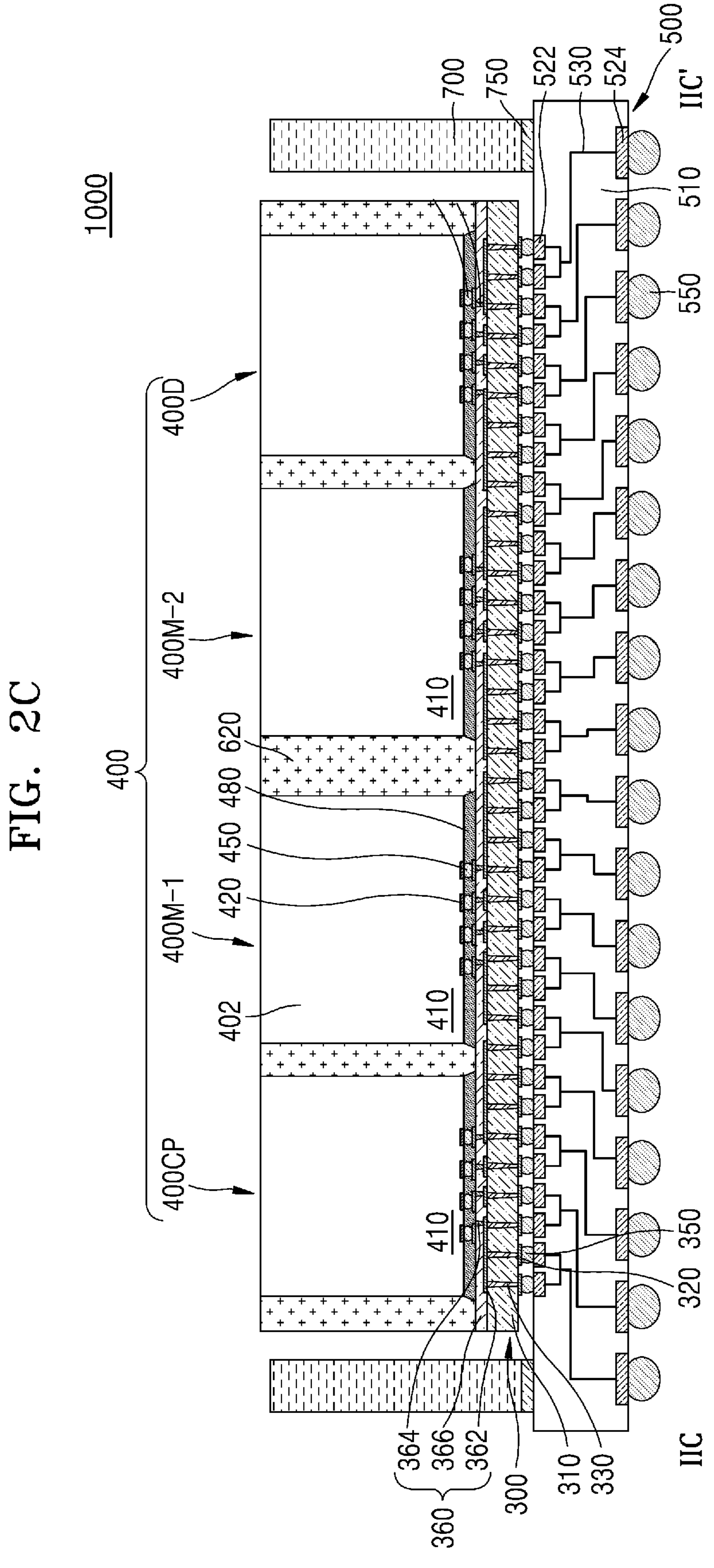

FIG. 1 is a plan view of a semiconductor package according to some embodiments, and FIGS. 2A to 2C are cross-sectional views of the semiconductor package of FIG. 1. In more detail, FIGS. 2A, 2B, and 2C are cross-sectional views of the semiconductor package of FIG. 1 taken along lines IIA-IIA', IIB-IIB', and IIC-IIC', respectively.

Referring to FIGS. 1 to 2C, a semiconductor package 1000 includes a package base substrate 500, an interposer 300 attached to the package base substrate 500, at least one stacked structure 1 attached to the interposer 300 and including a first semiconductor chip 100 and a plurality of second semiconductor chips 200 stacked on the first semiconductor chip 100, and a plurality of third semiconductor chips 400 attached to the interposer 300. The at least one stacked structure 1 and the plurality of third semiconductor chips 400 are spaced apart from each other in a horizontal direction, as illustrated in FIG. 1.

In FIG. 1, the semiconductor package 1000 is illustrated as including eight stacked structures 1 attached to the interposer 300, but is not limited thereto. For example, the semiconductor package 1000 may include one, two, four, six, eight, or more stacked structures 1. The stacked structure 1 may be referred to as a memory stack.

At least some of the plurality of third semiconductor chips 400 may be logic semiconductor chips. In some embodiments, the plurality of third semiconductor chips 400 may include at least two main semiconductor chips 400M-1 and 400M-2, at least one chiplet 400CP, and at least one dummy chip 400D. The main semiconductor chips 400M-1 and 400M-2 and the chiplet 400CP may be logic semiconductor chips including semiconductor devices such as logic devices. The dummy chip 400D may include a substrate made of a semiconductor material, but may not include a semiconductor device. The chiplet 400CP and the dummy chip 400D may have a relatively smaller size than the main semiconductor chips 400M-1 and 400M-2, that is, a relatively small horizontal area.

The package base substrate 500 may include a base board layer 510, and a plurality of board upper pads 522 and a plurality of board lower pads 524 respectively disposed on upper and lower surfaces of the base board layer 510. The package base substrate 500 may include a plurality of board wiring paths 530 that electrically connect the plurality of board upper pads 522 to the plurality of board lower pads 524 through the base board layer 510. In some embodiments, the package base substrate 500 may be a printed circuit board. For example, the package base substrate 500 may be a multi-layer printed circuit board.

The base board layer 510 may include at least one material selected from phenol resin, epoxy resin, and polyimide. For example, the base board layer 510 may include at least one material selected from, for example, frame retardant 4 (FR4), tetrafunctional epoxy, polyphenylene ether, epoxy/polyphenylene oxide, bismaleimide triazine (BT), thermount, cyanate ester, polyimide, and liquid crystal polymer. In some embodiments, the base board layer 510 may include, for example, polyester PET, polyester terephthalate, fluorinated ethylene propylene (FEP), resin-coated paper, a liquid polyimide resin, a polyethylene naphthalate (PEN) film, or the like. The base board layer 510 may be formed by stacking a plurality of base layers.

The plurality of board upper pads 522 and the plurality of board lower pads 524 may include copper, nickel, stainless steel, or beryllium copper. For example, the plurality of board upper pads 522 and the plurality of board lower pads 524 may include plated copper. In some embodiments, Ni/Au or the like may be included in surfaces of the plurality of board upper pads 522 and the plurality of board lower pads 524 opposite to the base board layer 510.

The plurality of board wiring paths 530 may include a plurality of buried conductive layers extending in a horizontal direction and a plurality of conductive vias extending in a vertical direction. The plurality of conductive vias may connect two of the plurality of buried conductive layers, the plurality of board upper pads 522, and the plurality of board lower pads 524 located at different vertical levels. The plurality of board wiring paths 530 may include, for example, electrolytically deposited (ED) copper, rolled-annealed (RA) copper foils, stainless steel foils, aluminum foils, ultra-thin copper foils, sputtered copper, copper alloys, nickel, stainless steel or beryllium copper.

The base board layer 510 may further include a solder resist layer (not shown) exposing the plurality of board upper pads 522 and the plurality of board lower pads 524 on an upper surface and a lower surface of the base board layer 510, respectively. The solder resist layer may include a polyimide film, a polyester film, a flexible solder mask, a photoimageable coverlay (PIC), a photo-imageable solder resist, or the like. The solder resist layer may be formed by, for example, thermosetting a thermosetting ink applied by a silk screen printing method or an inkjet method. The solder resist layer may be formed by, for example, removing a portion of the photosensitive solder resist applied by a screen method or a spray coating method through exposure and development and then thermal curing. The solder resist layer may be formed by, for example, laminating a polyimide film or a polyester film.

A plurality of interposer connection terminals 350 may be connected to the plurality of board upper pads 522, and a plurality of external connection terminals 550 may be connected to the plurality of board lower pads 524. The plurality of interposer connection terminals 350 may electrically connect between the interposer 300 and the package base substrate 500. The plurality of external connection terminals 550 connected to the plurality of board lower pads 524 may connect the semiconductor package 1000 to the outside (i.e., to other elements and/or devices). In some embodiments, each of the plurality of interposer connection terminals 350 and the plurality of external connection terminals 550 may be a bump, a solder ball, or the like.

The interposer 300 may be used to implement a vertical connection terminal for interconnecting the at least one stacked structure 1 and the plurality of third semiconductor chips 400 and the package base substrate 500 in a fine pitch type. The interposer 300 includes a base layer 310, a plurality of interposer lower pads 320 below the base layer 310, a plurality of interposer through-electrodes 330 penetrating the base layer 310 to connect between upper and lower surfaces of the base layer 310, and an interposer wiring structure 360 on the base layer 310. A plurality of interposer connection terminals 350 may be attached to the plurality of interposer lower pads 320. The plurality of interposer connection terminals 350 are interposed between the plurality of board upper pads 522 and the plurality of interposer lower pads 320 to electrically connect the interposer 300 to the package base substrate 500.

The base layer 310 may include a semiconductor material, glass, ceramic, or plastic. For example, the base layer 310 may include silicon. In some embodiments, the interposer 300 may be a silicon interposer in which the base layer 310 is formed from a silicon semiconductor substrate.

Each of the plurality of interposer through-electrodes 330 may include a conductive plug penetrating the base layer 310 and a conductive barrier layer surrounding the conductive plug. The conductive plug may include copper (Cu) or tungsten (W), and the conductive barrier layer may include a metal or a conductive metal nitride. The conductive plug may have a cylindrical shape, and the conductive barrier layer may have a cylindrical shape surrounding a sidewall of the conductive plug. A plurality of via insulating layers may be interposed between the base layer 310 and the plurality of interposer through-electrodes 330 to surround sidewalls of the plurality of interposer through-electrodes 330. The plurality of via insulating layers may prevent direct contact between the base layer 310 and the plurality of interposer through-electrodes 330. The via insulating layer may include an oxide layer, a nitride layer, a carbide layer, a polymer, or a combination thereof.

The interposer wiring structure 360 may include a plurality of interposer wiring line patterns 362, a plurality of interposer wiring vias 364, and an interposer wiring insulating layer 366. In some embodiments, the interposer wiring structure 360 may be formed by a re-wiring process.

An interposer wiring line pattern 362 and an interposer wiring via 364 may be, for example, copper (Cu), aluminum (Al), W, titanium (Ti), tantalum (Ta), indium (In), molybdenum (Mo), manganese (Mn), cobalt (Co), tin (Sn), Nickel (Ni), magnesium (Mg), rhenium (Re), beryllium (Be), gallium (Ga), ruthenium (Ru), or an alloy thereof, but is not limited thereto. In some embodiments, the interposer wiring line pattern 362 and the interposer wiring via 364 may be formed by stacking a metal or an alloy of a metal on a seed layer including titanium, titanium nitride, or titanium tungsten. The interposer wiring line pattern 362 may be on at least one of an upper surface and a lower surface of the interposer wiring insulating layer 366. The interposer wiring via 364 may pass through the interposer wiring insulating layer 366 to contact and connect to a portion of the interposer wiring line pattern 362. In some embodiments, at least some of the plurality of interposer wiring line patterns 362 may be formed together with some of the plurality of interposer wiring vias 364 to form an integral body. For example, the interposer wiring line pattern 362 and the interposer wiring via 364 in contact with a lower surface of the interposer wiring line pattern 362 may form an integral body. In some embodiments, the interposer wiring via 364 may have a tapered shape extending horizontally from the lower side to the upper side. That is, a horizontal width of the interposer wiring via 364 may increase as it moves away from the package base substrate 500.

The interposer wiring insulating layer 366 may include, for example, a photo imageable dielectric (PID) or a photosensitive polyimide (PSPI). In some embodiments, the interposer wiring structure 360 may include a plurality of stacked interposer wiring insulating layers 366.

In some other embodiments, the interposer wiring structure 360 may be formed by a semiconductor back end of line (BEOL) process. The interposer wiring line pattern 362 and the interposer wiring via 364 may include a metal material such as Cu, Al, and W. The interposer wiring insulating layer 366 may include a High Density Plasma (HDP) oxide film, a TEOS oxide film, Tonen SilaZene (TOSZ), Spin On Glass (SOG), Undoped Silica Glass (USG), or a low-k dielectric layer.

Some of the plurality of interposer wiring line patterns 362 disposed on the interposer 300 may be referred to as interposer upper pads. A plurality of first chip connection terminals 150 and a plurality of third chip connection terminals 450 may be attached to the interposer upper pads. In some embodiments, each of the plurality of first chip connection terminals 150 and the plurality of third chip connection terminals 450 may be a bump, a solder ball, or the like. A first underfill layer 180 surrounding the plurality of first chip connection terminals 150 may be between the interposer 300 and the stacked structure 1, and a second underfill layer 480 surrounding the plurality of third chip connection terminals 450 may be between the interposer 300 and a third semiconductor chip 400. The first underfill layer 180 and the second underfill layer 480 may include, for example, an epoxy resin formed by a capillary under-fill method. In some embodiments, the first underfill layer 180 and the second underfill layer 480 may be a non-conductive film (NCF).

The stacked structure 1 may include the first semiconductor chip 100 and the plurality of second semiconductor chips 200. In FIGS. 2A and 2B, the at least one stacked structure 1 is illustrated as including one first semiconductor chip 100 and four second semiconductor chips 200, but is not limited thereto. For example, the stacked structure 1 may include two or more second semiconductor chips 200. In some embodiments, one stacked structure 1 may include a multiple of 4 second semiconductor chips 200. The plurality of second semiconductor chips 200 may be sequentially stacked on the first semiconductor chip 100 in a vertical direction. The first semiconductor chip 100 and the plurality of second semiconductor chips 200 may be sequentially stacked with active surfaces facing downward, that is, toward the interposer 300.

The first semiconductor chip 100 and the plurality of second semiconductor chips 200 may be dynamic random access memory (DRAM), static random access memory (SRAM), flash memory, electrically erasable and programmable read-only memory (EEPROM), phase-change random access memory (PRAM), magnetic random access memory (MRAM), or resistive random access memory (RRAM).

In some embodiments, the first semiconductor chip 100 may not include a memory cell. The first semiconductor chip 100 may include a serial-parallel conversion circuit, a test logic circuit such as a design for test (DFT), a joint test action group (JTAG), a memory built-in self-test (MBIST), and a signal interface circuit such as a PHY. The plurality of second semiconductor chips 200 may include memory cells. For example, the first semiconductor chip 100 may be a buffer chip for controlling the plurality of second semiconductor chips 200.

In some embodiments, the first semiconductor chip 100 may be a buffer chip for controlling HBM DRAM, the plurality of second semiconductor chips 200 may be memory cell chips including HBM DRAM cells controlled by the first semiconductor chip 100. The first semiconductor chip 100 may be referred to as a buffer chip or a master chip, and a second semiconductor chip 200 may be referred to as a slave chip or a memory cell chip. The stacked structure 1 including the first semiconductor chip 100 and the plurality of second semiconductor chips 200 sequentially stacked on the first semiconductor chip 100 may be referred to as an HBM DRAM device.

The first semiconductor chip 100 includes a first substrate 102, a plurality of first front connection pads 122, a plurality of first rear connection pads 124, and a plurality of first through-electrodes 130. The second semiconductor chip 200 includes a second substrate 202, a plurality of second front connection pads 222, a plurality of second rear connection pads 224, and a plurality of second through-electrodes 230.

The first substrate 102 and the second substrate 202 may include silicon (Si). Alternatively, the first substrate 102 and the second substrate 202 may include a semiconductor element such as germanium (Ge), or a compound semiconductor such as silicon carbide (SiC), gallium arsenide (GaAs), indium arsenide (InAs), and indium phosphide (InP). The first substrate 102 and the second substrate 202 may have the active surface and an inactive surface opposite to the active surface. The first substrate 102 and the second substrate 202 may include a plurality of individual devices of various types on the active surface. The plurality of individual devices may include various microelectronic devices, for example, a metal-oxide-semiconductor field effect transistor (MOSFET) such as a complementary metal-insulator-semiconductor (CMOS) transistor, an image sensor such as system large scale integration (LSI) and a CMOS imaging sensor (CIS), a micro-electro-mechanical system (MEMS), an active device, or a passive device. The active surface and the inactive surface of the first substrate 102 may be referred to as a first active surface and a first inactive surface, and the active surface and the inactive surface of the second substrate 202 may be referred to as a second active surface and a second inactive surface.

The first semiconductor chip 100 and the second semiconductor chip 200 may include a first semiconductor device 110 and a second semiconductor device 210 configured by the plurality of individual devices. The first semiconductor device 110 may be on a first active surface of the first substrate 102, the plurality of first front connection pads 122 and the plurality of first rear connection pads 124 are on the first active surface and a first inactive surface of the first substrate 102, respectively, and the plurality of first through-electrodes 130 vertically penetrate at least a portion of the first substrate 102 to electrically connect the plurality of first front connection pads 122 to the plurality of first rear connection pads 124.

The second semiconductor device 210 may be formed on a second active surface of the second substrate 202, the plurality of second front connection pads 222 and the plurality of second rear connection pads 224 are on the second active surface and a second inactive surface of the second substrate 202, respectively, and the plurality of second through-electrodes 230 vertically penetrate at least a portion of the second substrate 202 to electrically connect the plurality of second front connection pads 222 to the plurality of second rear connection pads 224. The plurality of second through-electrodes 230 may be electrically connected to the plurality of first through-electrodes 130.

The stacked structure 1 may be electrically connected to the interposer 300 through the plurality of first front connection pads 122. In some embodiments, the plurality of first chip connection terminals 150 may be interposed between the plurality of first front connection pads 122 and a plurality of interposer upper pads from among the plurality of interposer wiring line patterns 362 to electrically connect the plurality of first front connection pads 122 to the plurality of interposer upper pads. A plurality of second chip connection terminals 250 may be attached respectively to the plurality of second front connection pads 222 of the plurality of second semiconductor chips 200. The plurality of second chip connection terminals 250 may be interposed between the plurality of first rear connection pads 124 of the first semiconductor chip 100 and the plurality of second front connection pads 222 of a lowermost second semiconductor chip 200 from among the plurality of second semiconductor chips 200, and between the plurality of second front connection pads 222 of the remaining second semiconductor chips 200 from among the plurality of second semiconductor chips 200 and the plurality of second rear connection pads 224 of the other second semiconductor chip 200 thereunder to electrically connect the first semiconductor chip 100 to the plurality of second semiconductor chips 200. Each of the plurality of second chip connection terminals 250 may be a bump, a solder ball, or the like.

In some embodiments, among the plurality of second semiconductor chips 200, a second semiconductor chip 200H on the top arranged farthest from the first semiconductor chip 100 may not include a second rear connection pad 224 and a second through-electrode 230. In some embodiments, among the plurality of second semiconductor chips 200, the second semiconductor chip 200H on the top arranged farthest from the first semiconductor chip 100 may have a thickness greater than that of the other second semiconductor chips 200.

An insulating adhesive layer 260 may be between the first semiconductor chip 100 and a lowermost second semiconductor chip 200 from among the plurality of second semiconductor chips 200 and between the plurality of second semiconductor chips 200. The insulating adhesive layer 260 is attached to a lower surface of each of the plurality of second semiconductor chips 200 to attach each of the plurality of second semiconductor chips 200 to a lower structure, for example, on the first semiconductor chip 100 or another second semiconductor chip 200 at a lower portion of the plurality of second semiconductor chips 200. The insulating adhesive layer 260 may include a non-conductive film (NCF), a non-conductive paste (NCP), an insulating polymer, or an epoxy resin. The insulating adhesive layer 260 may surround the plurality of second chipe connection terminals 250 and fill between the first semiconductor chip 100 and the lowermost second semiconductor chip 200 from among the plurality of second semiconductor chips 200 and between the plurality of second semiconductor chips 200.

A horizontal width and a size of the first semiconductor chip 100 may be greater than a horizontal width and a size of each of the plurality of second semiconductor chips 200. For example, the plurality of second semiconductor chips 200 may all overlap the first semiconductor chip 100 in a vertical direction. In some embodiments, the plurality of second semiconductor chips 200 may all overlap each other in a vertical direction.

The stacked structure 1 may further include a chip molding layer 610 surrounding the plurality of second semiconductor chips 200 and the plurality of insulating adhesive layers 260 on an upper surface of the first semiconductor chip 100, that is, on the first inactive surface of the first substrate 102. The chip molding layer 610 may cover a portion of the upper surface of the first semiconductor chip 100, that is, the first inactive surface of the first substrate 102, and may cover a side surface of the plurality of second semiconductor chips 200. In some embodiments, a side surface of the first semiconductor chip 100 and a side surface of the chip molding layer 610 corresponding to each other may be aligned in a vertical direction (a Z direction) to be flush with each other. In some embodiments, the chip molding layer 610 covers the side surface of the plurality of second semiconductor chips 200, but may expose an upper surface of the second semiconductor chip 200H on the top, that is, an inactive surface of the second substrate 202 of the second semiconductor chip 200H on the top without covering it. The chip molding layer 610 may be formed of, for example, EMC.

The third semiconductor chip 400 may include a third substrate 402 and a plurality of third front connection pads 420. The plurality of third front connection pads 420 may be on a third active surface of the third substrate 402. Because the third substrate 402 is substantially similar to the first substrate 102 and the second substrate 202, a detailed description thereof will be omitted. The third substrate 402 may have an active surface and an inactive surface opposite to the active surface. The active surface and the inactive surface of the third substrate 402 may be referred to as a third active surface and a third inactive surface. At least some of the plurality of third semiconductor chips 400 may include a third semiconductor device 410. The third semiconductor device 410 may be formed on the third active surface of the third substrate 402.

The third semiconductor chip 400 may be electrically connected to the interposer 300 through the plurality of third front connection pads 420. In some embodiments, the plurality of third chip connection terminals 450 may be interposed between the plurality of third front connection pads 420 and a plurality of interposer upper pads from among the plurality of interposer wiring line patterns 362 to electrically connect the plurality of third front connection pads 420 to the plurality of interposer upper pads.

At least some of the plurality of third semiconductor chips 400 may include, for example, one of a central processing unit (CPU) chip, a graphic processing unit (GPU) chip, an application processor (AP) chip, an application specific integrated circuit (ASIC), or other processing chips. The main semiconductor chips 400M-1 and 400M-2 may have a plurality of functional blocks. The functional block is also called IP (Intellectual Property), and refers to a unit block divided into functional units that can be actually developed. The chiplet 400CP may have one functional block. The main semiconductor chips 400M-1 and 400M-2 and the chiplet 400CP may include the third semiconductor device 410, but the dummy chip 400D may not include the third semiconductor device 410.

The plurality of third semiconductor chips 400 may include at least two main semiconductor chips 400M-1 and 400M-2, that is, the first main semiconductor chip 400M-1 and the second main semiconductor chip 400M-2. The first main semiconductor chip 400M-1, the second main semiconductor chip 400M-2, and the chiplet 400CP may have different functional blocks.

The first main semiconductor chip 400M-1, the second main semiconductor chip 400M-2, and the chiplet 400CP may be electrically connected to each other through the interposer 300. For example, the first main semiconductor chip 400M-1, the second main semiconductor chip 400M-2, and the chiplet 400CP may be electrically connected to each other through the interposer wiring line pattern 362 of the interposer 300, or through the interposer wiring line pattern 362 and the interposer wiring via 364.

Among the plurality of third semiconductor chips 400, the rest except for the dummy chip 400D, that is, the first main semiconductor chip 400M-1, the second main semiconductor chip 400M-2, and the chiplet 400CP may be electrically connected to each other through the interposer 300 to function as one System on Chip (SoC). In other words, among the plurality of third semiconductor chips 400, the rest except for the dummy chip 400D, that is, the first main semiconductor chip 400M-1, the second main semiconductor chip 400M-2, and the chiplet 400CP may be chips formed separately by dividing functional blocks for constituting one SoC. In the present specification, for convenience, a chip including two or more functional blocks is called the main semiconductor chips 400M-1 and 400M-2, and a chip including one functional block is called the chiplet 400CP. In some embodiments, the semiconductor package 1000 does not include the main semiconductor chips 400M-1 and 400M-2 including two or more functional blocks, and may include a plurality of chiplets 400CP in which each of the functional blocks included in the main semiconductor chips 400M-1 and 400M-2 is formed as a separate chip.

In FIG. 1, some of the plurality of third semiconductor chips 400 and the others are symmetrically arranged around the plurality of stacked structures 1, but the present inventive concept is not limited thereto. In addition, although FIG. 1 illustrates that the two main semiconductor chips 400M-1 and 400M-2 are symmetrically arranged around the plurality of stacked structures 1, respectively, the present inventive concept is not limited thereto.

The semiconductor package 1000 may further include a package molding layer 620 surrounding the at least one stacked structure 1 and the plurality of third semiconductor chips 400 on the interposer 300. The package molding layer 620 may be formed of, for example, EMC. In some embodiments, the package molding layer 620 may not cover the upper surface of the second semiconductor chip 200H on the top and an upper surface of the plurality of third semiconductor chips 400. For example, the package molding layer 620 may cover a side surface of the plurality of third semiconductor chips 400. In some embodiments, the package molding layer 620 may surround a side surface of the chip molding layer 610 surrounding the plurality of second semiconductor chips 200 included in the at least one stacked structure 1, and a side surface of the first semiconductor chip 100 included in the at least one stacked structure 1. For example, the upper surface of the second semiconductor chip 200H on the top, the upper surface of the plurality of third semiconductor chips 400, an upper surface of the chip molding layer 610, and an upper surface of the package molding layer 620 may be flush with each other. In some embodiments, a side surface of the interposer 300 and a side surface of the package molding layer 620 corresponding to each other may be aligned in the vertical direction (the Z direction) to be flush with each other.

On the interposer 300, the plurality of third semiconductor chips 400 may be arranged adjacent to opposite sides of the at least one stacked structure 1. For example, some of the plurality of third semiconductor chips 400 may be arranged adjacent to one side of the opposite sides of the at least one stacked structure 1, and the others may be arranged adjacent to the other side of the stack structure 1. The at least one stacked structure 1 may be between some and the rest of the plurality of third semiconductor chips 400.

The plurality of third semiconductor chips 400 attached to the interposer 300 may form two groups including a first chip group G400-1 and a second chip group G400-2 having at least one stacked structure 1 therebetween and apart from each other. On the interposer 300, the first chip group G400-1 and the second chip group G400-2 may have at least one stacked structure 1 therebetween and may be apart from each other.

The semiconductor package 1000 may include the plurality of stacked structures 1 attached to the interposer 300 and apart from each other in a horizontal direction. The plurality of stacked structures 1 attached to the interposer 300 may be adjacent to each other to form one group, and the plurality of stacked structures 1 may be referred to as a stacked structure group G1. On the interposer 300, the first chip group G400-1 and the second chip group G400-2 may have the stack structure group G1 therebetween and may be apart from each other.

In some embodiments, each of the first chip group G400-1 and the second chip group G400-2 may include the first main semiconductor chip 400M-1, the second main semiconductor chip 400M-2, the chiplet 400CP, and the dummy chip 400D. The first main semiconductor chip 400M-1, the second main semiconductor chip 400M-2, and the chiplet 400CP included in the first chip group G400-1 may have different functional blocks from those of the first main semiconductor chip 400M-1, the second main semiconductor chip 400M-2, and the chiplet 400CP included in the second chip group G400-2.

In some other embodiments, at least one of the first chip group G400-1 and the second chip group G400-2 may include one third semiconductor chip 400, and the stacked structure group G1 may include one stacked structure 1.

The first chip group G400-1, the stacked structure group G1, and the second chip group G400-2 may be sequentially arranged on the interposer 300 in a first horizontal direction (an X direction), as illustrated in FIG. 1.

In some embodiments, the third semiconductor chips 400 included in the first chip group G400-1 may be arranged in a column in the second horizontal direction (a Y direction) orthogonal to the first horizontal direction (the X direction), and the third semiconductor chips 400 included in the second chip group G400-2 may be arranged in a row in the second horizontal direction (the Y direction). The stacked structures 1 included in the stacked structure group G1 may be arranged in a row in the second horizontal direction (the Y direction), or may be arranged in a matrix arrangement in rows and columns in the first horizontal direction (the X direction) and the second horizontal direction (the Y direction).

In some embodiments, each of the first chip group G400-1, the second chip group G400-2, and the stacked structure group G1 may have a footprint of a planar rectangular shape. For example, among side surfaces of the third semiconductor chip 400 included in each of the first chip group G400-1 and the second chip group G400-2, when side surfaces of the first chip group G400-1 facing outward are extended, a planar rectangular shape may be formed. For example, among side surfaces of a stacked structure G1 included in the structure group G1, when side surfaces facing the outside of the stacked structure G1 are extended, a planar rectangular shape may be formed.

The interposer 300 may have a pair of first edges 300S1 opposite to each other in the first horizontal direction (the X direction), and a pair of second edges 300S2 opposite to each other in the second horizontal direction (the Y direction) and different from the pair of first edges 300S1, as illustrated in FIG. 1. Both ends of the one first edge 300S1 may be connected to one end of the pair of second edges 300S2, and both ends of the other first edge 300S1 may be connected to the other end of the pair of second edges 300S2. Similarly, both ends of the one second edge 300S2 may be connected to one end of the pair of first edges 300S1, and both ends of the other second edge 300S2 may be connected to the other end of the pair of first edges 300S1. The first edge 300S1 may be connected to the second edge 300S2 at a corner 300C of the interposer 300.

The first chip group G400-1 and the second chip group G400-2 may be arranged adjacent to the pair of first edges 300S1. That is, the first chip group G400-1 may be arranged adjacent to one first edge of the pair of first edges 300S1, and the second chip group G400-2 may be arranged adjacent to the other first edge of the pair of first edges 300S1. For example, the third semiconductor chips 400 included in the first chip group G400-1 and the third semiconductor chips 400 included in the second chip group G400-2 may be arranged in a row along the pair of first edges 300S1.

The first chip group G400-1, the stacked structure group G1, and the second chip group G400-2 may be sequentially arranged along the pair of second edges 300S2. For example, respective both ends of the first chip group G400-1, the stack structure group G1, and the second chip group G400-2 in the second horizontal direction (the Y direction) may be sequentially arranged along the pair of second edges 300S2.

Any one of the first chip group G400-1 and the second chip group G400-2 may be adjacent to four corners 300C of the interposer 300, any one of the first chip group G400-1 and the second chip group G400-2 may be between the stacked structure group G1 and the four corners 300C of the interposer 300, and the stacked structure group G1 may be apart from the pair of first edges 300S1 of the interposer 300 and the four corners 300C that are both ends of the pair of first edges 300S1.

A separation distance between a side surface of the stacked structure 1 adjacent to the pair of second edges 300S2 of the interposer 300 and the pair of second edges 300S2 may be equal to or greater than a separation distance between a side surface of the third semiconductor chip 400 and the pair of second edges 300S2.

In some embodiments, the side surface of the stacked structure 1 adjacent to the pair of second edges 300S2 of the interposer 300 and the side surface of the third semiconductor chip 400 may be apart from the pair of second edges 300S2 of the interposer 300 by a certain distance. For example, the side surface of the stacked structure 1 adjacent to the pair of second edges 300S2 of the interposer 300 and the side surface of the third semiconductor chip 400 may be aligned in a plane along an extension line SL extending in the first horizontal direction (the X direction), i.e., the side surface of the stacked structure 1 and the side surface of the third semiconductor chip 400 are equidistant from the second edge 300S2, as illustrated in FIG. 1.

The chip molding layer 610 may have a first thickness T1 in a horizontal direction from a side surface of the plurality of second semiconductor chips 200, for example, in each of the first horizontal direction (the X direction) and the second horizontal direction (the Y direction), as illustrated in FIG. 1. The package molding layer 620 may have a second thickness T2 in a second horizontal direction from a side surface of the stacked structure 1 adjacent to the pair of second edges 300S2 of the interposer 300 and a side surface of the third semiconductor chip 400, as illustrated in FIG. 1. The second thickness T2 may be twice or more than the first thickness T1. For example, the first thickness T1 may be about 150 μm to about 400 μm, and the second thickness T2 may be about 500 μm to about 1000 μm. For example, a separation distance between the side surface of the stacked structure 1 adjacent to the pair of second edges 300S2 of the interposer 300 and the side surface of the third semiconductor chip 400 and the pair of second edges 300S2 of the interposer 300 may have the same value as the second thickness T2.

The package molding layer 620 may have the second thickness T2 in a horizontal direction from the side surface of the third semiconductor chip 400 adjacent to the pair of first edges 300S1 of the interposer 300, but is not limited thereto. For example, the package molding layer 620 may have a thickness different from the second thickness T2 in the horizontal direction from the side surface of the third semiconductor chip 400 adjacent to the pair of first edges 300S1 of the interposer 300.

A molding interface may be formed between the chip molding layer 610 and the package molding layer 620. The molding interface may be an upper portion of the first semiconductor chip 100 in the side surface of the stacked structure 1. Because the molding interface is planarly the same as the side surface of the stacked structure 1, the description of the arrangement of the molding interface may be equally applied to the side surface of the stacked structure 1.

The molding interface adjacent to the pair of second edges 300S2 may be horizontally apart from the pair of second edges 300S2 of the interposer 300 by a certain distance, that is, the second thickness T2. The molding interface or the side surface of the stacked structure 1 may have any one of the first chip group G400-1 and the second chip group G400-2 between the four corners 300C of the interposer 300, and may be apart from the pair of first edges 300S1 of the interposer 300 and the four corners 300C that are both ends of the pair of first edges 300S1. The molding interface adjacent to the pair of second edges 300S2 or the side surface of the stacked structure 1 may not protrude toward the pair of second edges 300S2 with respect to the side surface of the third semiconductor chip 400 adjacent to the pair of second edges 300S2 (i.e., the side surface of the stacked structure 1 is not closer to a second edge 300S2 than a side surface of the third semiconductor chip 400 that is adjacent to the same second edge 300S2).

Because a molding interface between the chip molding layer 610 and the package molding layer 620 has any one of the first chip group G400-1 and the second chip group G400-2 therebetween and is apart from the four corners 300C of the interposer 300, the semiconductor package 1000 according to the present inventive concept may minimize warpage around the four corners 300C of the interposer 300. Because the molding interface has any one of the first chip group G400-1 and the second chip group G400-2 therebetween and is apart from the pair of first edges 300S1 of the interposer 300, the semiconductor package 1000 according to the present inventive concept may minimize warpage adjacent to the pair of first edges 300S1 of the interposer 300. In addition, because the molding interface adjacent to the pair of second edges 300S2 of the interposer 300 does not protrude toward the pair of second edges 300S2 based on the side surface of the third semiconductor chip 400 adjacent to the pair of second edges 300S2, the semiconductor package 1000 according to the present inventive concept may minimize warpage adjacent to the pair of second edges 300S2 of the interposer 300.

Accordingly, the semiconductor package 1000 according to the present inventive concept may minimize warpage of the interposer 300 due to a molding interface between the chip molding layer 610 and the package molding layer 620, and thus, may have structural reliability and may further have connection reliability between the interposer 300 and the package base substrate 500.

The semiconductor package 1000 may further include a stiffener structure 700 attached to the package base substrate 500. The stiffener structure 700 may be attached to the package base substrate 500 with a stiffener thermal interface material layer 750 therebetween. The stiffener structure 700 may be apart from the stack structure 1 and the third semiconductor chip 400 In some embodiments, the stiffener structure 700 may be attached on the package base substrate 500 to be apart from the interposer 300. The stiffener structure 700 may extend along an edge of the package base substrate 500 in a plan view, that is, in a top-view, to surround the stacked structure 1 and the third semiconductor chip 400. The stiffener structure 700 may extend along the edge of the package base substrate 500 and may have a rectangular ring shape surrounding the interposer 300 in a plan view. The stiffener structure 700 may have a shape in which four sidewalls respectively extending along four edges of the package base substrate 500 are connected to each other.

The stiffener structure 700 may include metal. For example, the stiffener structure 700 may include at least one of copper, nickel, and stainless steel. The stiffener thermal interface material layer 750 may include an insulating material or a material capable of maintaining electrical insulation including the insulating material. The stiffener thermal interface material layer 750 may include, for example, an epoxy resin. The stiffener thermal interface material layer 750 may be, for example, mineral oil, grease, gap filler putty, phase change gel, phase change material pads, or a particle-filled epoxy.

For example, the stiffener structure 700 may have a width of about 50 μm to about 100 μm in a horizontal direction. For example, an edge of the stiffener structure 700 and the package base substrate 500 may have a separation distance of 0 to about 1 mm. In some embodiments, an upper surface of the stiffener structure 700 may be located at a lower vertical level than the upper surface of the second semiconductor chip 200H on the top, the upper surface of the plurality of third semiconductor chips 400, the upper surface of the chip molding layer 610, and the upper surface of the package molding layer 620. For example, the stiffener structure 700 may have a vertical height of about 500 μm to about 800 μm.

Figure 3:
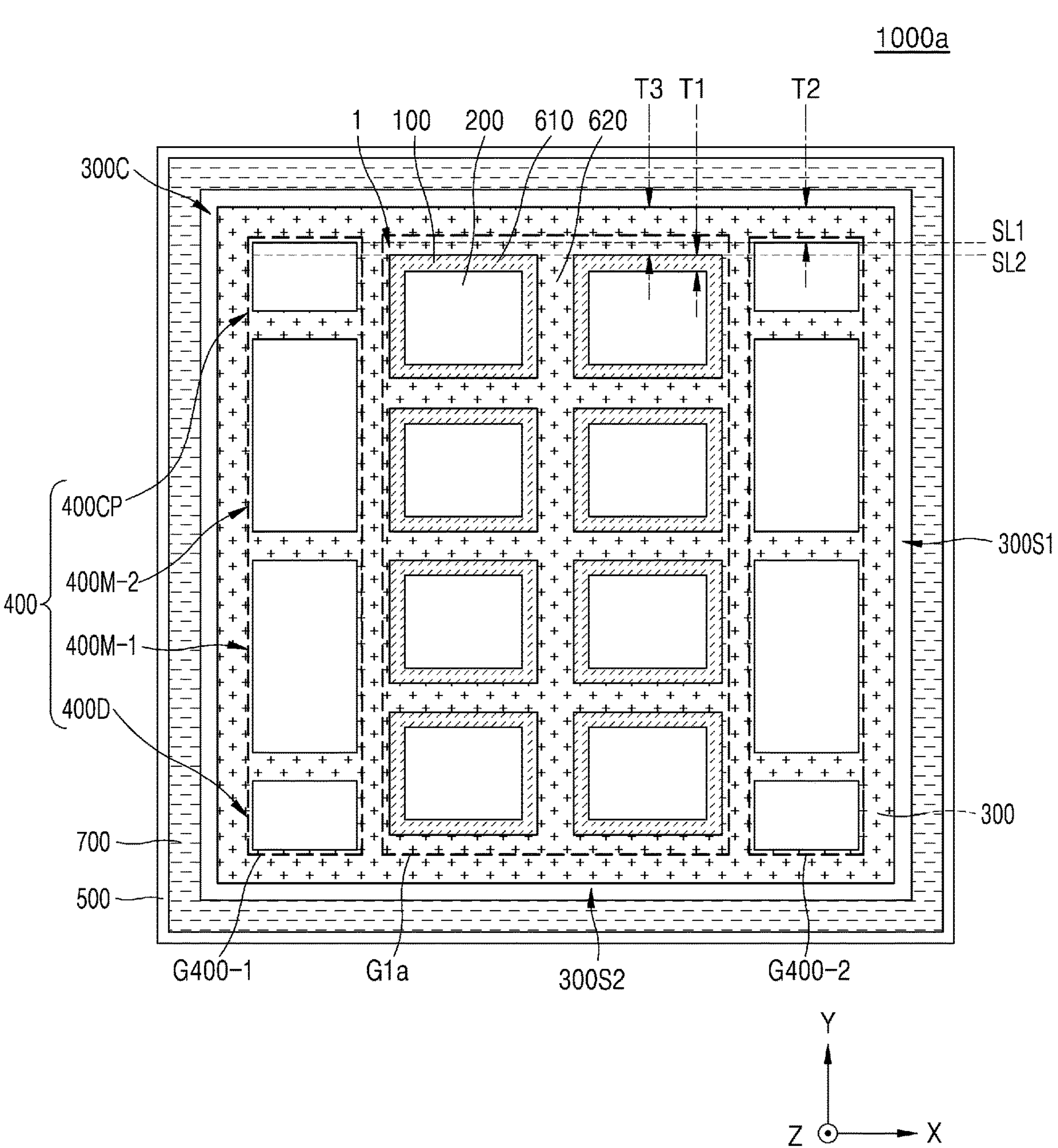
FIG. 3 is a plan view of a semiconductor package according to some embodiments.

FIG. 3 is a plan view of a semiconductor package according to some embodiments. A cross-sectional view of a semiconductor package **1000*a* shown in FIG. 3 is substantially the same as the cross-sectional views of the semiconductor package 1000 shown in FIGS. 2A to 2C. In FIG. 3, the same reference numerals as in FIGS. 1 to 2C indicate the same components, and the content overlapping with FIGS. 1 to 2C may be omitted, and FIG. 3 may be described with reference to FIGS. 2A to 2**C together.

Referring to FIG. 3, the semiconductor package **1000*a* includes the package base substrate 500, the interposer 300 attached to the package base substrate 500, at least one stacked structure 1 attached to the interposer 300, and the plurality of third semiconductor chips 400 attached to the interposer 300**.

The plurality of third semiconductor chips 400 attached to the interposer 300 may form two groups including the first chip group G400-1 and the second chip group G400-2 having the at least one stacked structure 1 therebetween and apart from each other. On the interposer 300, the first chip group G400-1 and the second chip group G400-2 may have the at least one stacked structure 1 therebetween and may be apart from each other.

The semiconductor package 1000*a* may include the plurality of stacked structures 1 attached to the interposer 300 and apart from each other in a horizontal direction. The plurality of stacked structures 1 attached to the interposer 300 may be adjacent to each other to form one group, and the plurality of stacked structures 1 may be referred to as a stacked structure group G1*a*. On the interposer 300, the first chip group G400-1 and the second chip group G400-2 may have the stack structure group G1*a* therebetween and may be spaced apart from each other, as illustrated.

The first chip group G400-1, the stacked structure group G1*a*, and the second chip group G400-2 may be sequentially arranged on the interposer 300 in the first horizontal direction (the X direction).

The stacked structures 1 included in the stacked structure group G1*a* may be arranged in a row in the second horizontal direction (the Y direction), or may be arranged in a matrix arrangement in rows and columns in the first horizontal direction (the X direction) and the second horizontal direction (the Y direction). In some embodiments, the stacked structure group G1*a* may have a footprint of a planar rectangular shape.

The first chip group G400-1, the stacked structure group G1*a*, and the second chip group G400-2 may be sequentially arranged along the pair of second edges 300S2. For example, respective both ends of the first chip group G400-1, the stack structure group G1*a*, and the second chip group G400-2 in the second horizontal direction (the Y direction) may be sequentially arranged along the pair of second edges 300S2.

Any one of the first chip group G400-1 and the second chip group G400-2 may be between the stacked structure group G1*a* and the four corners 300C of the interposer 300, and the stacked structure group G1*a* may be apart from the pair of first edges 300S1 of the interposer 300 and the four corners 300C that are both ends of the pair of first edges 300S1.

In some embodiments, the separation distance between the side surface of the stacked structure 1 adjacent to the pair of second edges 300S2 of the interposer 300 and the pair of second edges 300S2 may be greater than a separation distance between the side surface of the third semiconductor chip 400 adjacent to the pair of second edges 300S2 of the interposer 300 and the pair of second edges 300S2. For example, the side surface of the third semiconductor chip 400 adjacent to the pair of second edges 300S2 of the interposer 300 may be planarly aligned along a first extension line SL1 extending in the first horizontal direction (the X direction), and the side surface of the stacked structure 1 adjacent to the pair of second edges 300S2 of the interposer 300 may be aligned along a second extension line SL2 extending in the first horizontal direction (the X direction), as illustrated in FIG. 3. The second extension line SL2 may be further apart from the pair of second edges 300S2 of the interposer 300 than the first extension line SL1, i.e., the side surface of the stacked structure 1 and the side surface of the third semiconductor chip 400 are not equidistant from the second edge 300S2, as illustrated in FIG. 3.

The chip molding layer 610 may have the first thickness T1 in a horizontal direction from a side surface of the plurality of second semiconductor chips 200, for example, in each of the first horizontal direction (the X direction) and the second horizontal direction (the Y direction). The package molding layer 620 may have the second thickness T2 in the second horizontal direction (the Y direction) from the side surface of the third semiconductor chip 400 adjacent to the pair of second edges 300S2 of the interposer 300, and may have a third thickness T3 in the second horizontal direction (the Y direction) from the side surface of the stacked structure 1 adjacent to the pair of second edges 300S2 of the interposer 300. The second thickness T2 may be at least twice as large as the first thickness T1, and the third thickness T3 may be greater than the second thickness T2.

A molding interface may be formed between the stacked structure 1 and the package molding layer 620 and between the chip molding layer 610 and the package molding layer 620. The molding interface adjacent to the pair of second edges 300S2 may be apart from the pair of second edges 300S2 of the interposer 300 by a certain distance, that is, the third thickness T3. The molding interface, that is, the side surface of the stacked structure 1 may have any one of the first chip group G400-1 and the second chip group G400-2 between the four corners 300C of the interposer 300, and may be apart from the pair of first edges 300S1 of the interposer 300 and the four corners 300C that are both ends of the pair of first edges 300S1. The molding interface adjacent to the pair of second edges 300S2 may be recessed into the interposer 300 without protruding toward the pair of second edges 300S2 with respect to the side surface of the third semiconductor chip 400 adjacent to the pair of second edges 300S2.

Because the molding interface between the chip molding layer 610 and the package molding layer 620 has any one of the first chip group G400-1 and the second chip group G400-2 therebetween and is apart from the four corners 300C of the interposer 300, the semiconductor package 1000*a* according to the present inventive concept may minimize warpage adjacent to the four corners 300C of the interposer 300. Because the molding interface has any one of the first chip group G400-1 and the second chip group G400-2 therebetween and is apart from the pair of first edges 300S1 of the interposer 300, the semiconductor package 1000*a* according to the present inventive concept may minimize warpage adjacent to the pair of first edges 300S1 of the interposer 300. In addition, because the molding interface adjacent to the pair of second edges 300S2 of the interposer 300 is recessed into the interposer 300 without protruding toward the pair of second edges 300S2 with respect to the side surface of the third semiconductor chip 400 adjacent to the pair of second edges 300S2, the semiconductor package 1000*a* according to the present inventive concept may minimize warpage adjacent to the pair of second edges 300S2 of the interposer 300.

Accordingly, the semiconductor package 1000*a* according to the present inventive concept may minimize warpage of the interposer 300 due to the molding interface between the chip molding layer 610 and the package molding layer 620, and thus, may have structural reliability and may further have connection reliability between the interposer 300 and the package base substrate 500.

Figure 4A:
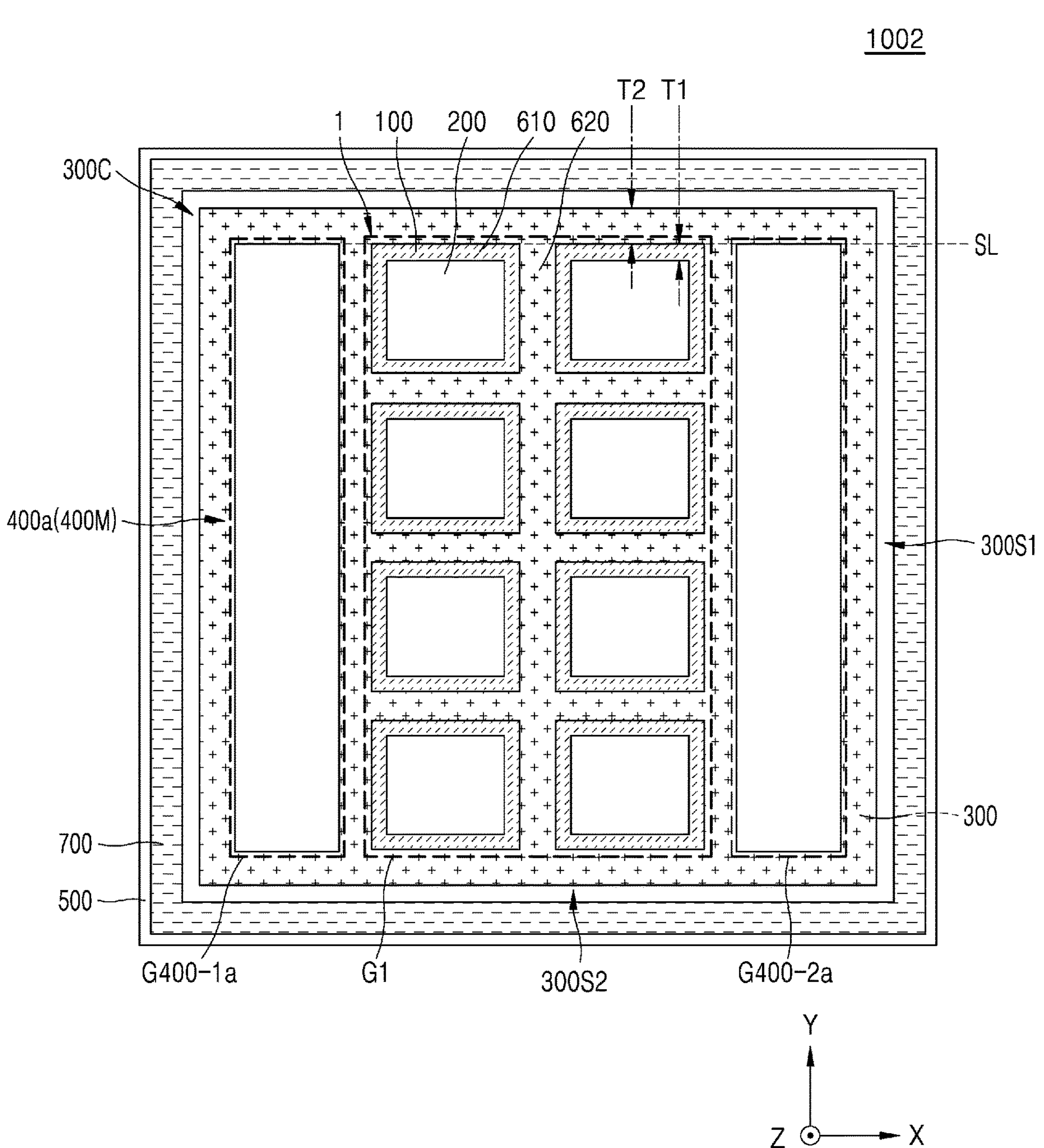
FIGS. 4A and 4B are plan views of a semiconductor package according to some embodiments.
Figure 4B:
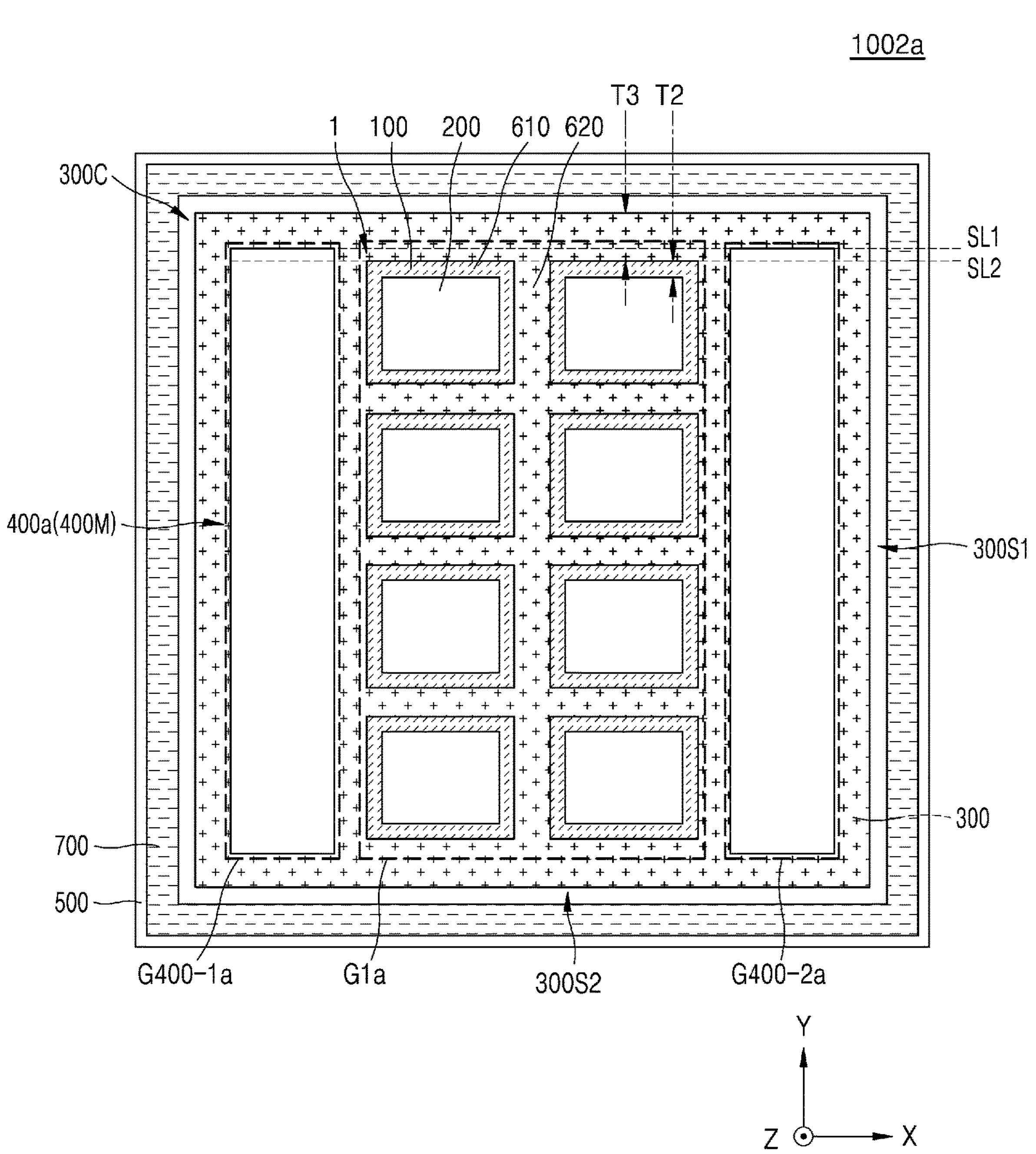

FIGS. 4A and 4B are plan views of a semiconductor package according to some embodiments. In FIGS. 4A and 4B, the same reference numerals as in FIGS. 1 to 3 indicate the same components, and the content overlapping with FIGS. 1 to 3 may be omitted, and FIGS. 4A and 4B may be described with reference to FIGS. 2A to 2C together.

Referring to FIG. 4A, a semiconductor package 1002 includes the package base substrate 500, the interposer 300 attached to the package base substrate 500, at least one stacked structure 1 attached to the interposer 300, and a plurality of third semiconductor chips 400*a* attached to the interposer 300.

The plurality of third semiconductor chips 400*a* attached to the interposer 300 may form two groups including a first chip group G400-1*a* and a second chip group G400-2*a* having the at least one stacked structure 1 therebetween and apart from each other. On the interposer 300, the first chip group G400-1*a* and the second chip group G400-2*a* may have the at least one stacked structure 1 therebetween and may be apart from each other.

In some embodiments, the first chip group G400-1*a* and the second chip group G400-2*a* may include one third semiconductor chip 400. For example, the third semiconductor chip 400 included in the first chip group G400-1*a* and the second chip group G400-2*a* may be a main semiconductor chip 400M having a plurality of functional blocks. On the interposer 300, the first chip group G400-1*a* and the second chip group G400-2*a* may have the stack structure group G1 therebetween and may be apart from each other.

The side surface of the stacked structure 1 and the side surface of the third semiconductor chip 400 may be aligned in a plane along the extension line SL extending in the first horizontal direction (the X direction). A molding interface may be formed between the chip molding layer 610 and the package molding layer 620. The molding interface may not protrude toward the pair of second edges 300S2 with respect to the side surface of the third semiconductor chip 400 adjacent to the pair of second edges 300S2.

Referring to FIG. 4B, a semiconductor package 1002*a* includes the package base substrate 500, the interposer 300 attached to the package base substrate 500, at least one stacked structure 1 attached to the interposer 300, and the plurality of third semiconductor chips 400*a* attached to the interposer 300.

The plurality of third semiconductor chips 400*a* attached to the interposer 300 may form two groups including the first chip group G400-1*a* and the second chip group G400-2*a* having the at least one stacked structure 1 therebetween and apart from each other. In some embodiments, the first chip group G400-1*a* and the second chip group G400-2*a* may include one third semiconductor chip 400. On the interposer 300, the first chip group G400-1*a* and the second chip group G400-2*a* may have the stack structure group G1 therebetween and may be apart from each other. The plurality of stacked structures 1 attached to the interposer 300 may form one stacked structure group G1*a*.

A molding interface may be formed between the chip molding layer 610 and the package molding layer 620. The molding interface adjacent to the pair of second edges 300S2 may be recessed into the interposer 300 without protruding toward the pair of second edges 300S2 with respect to the side surface of the third semiconductor chip 400 adjacent to the pair of second edges 300S2.

Figure 5:
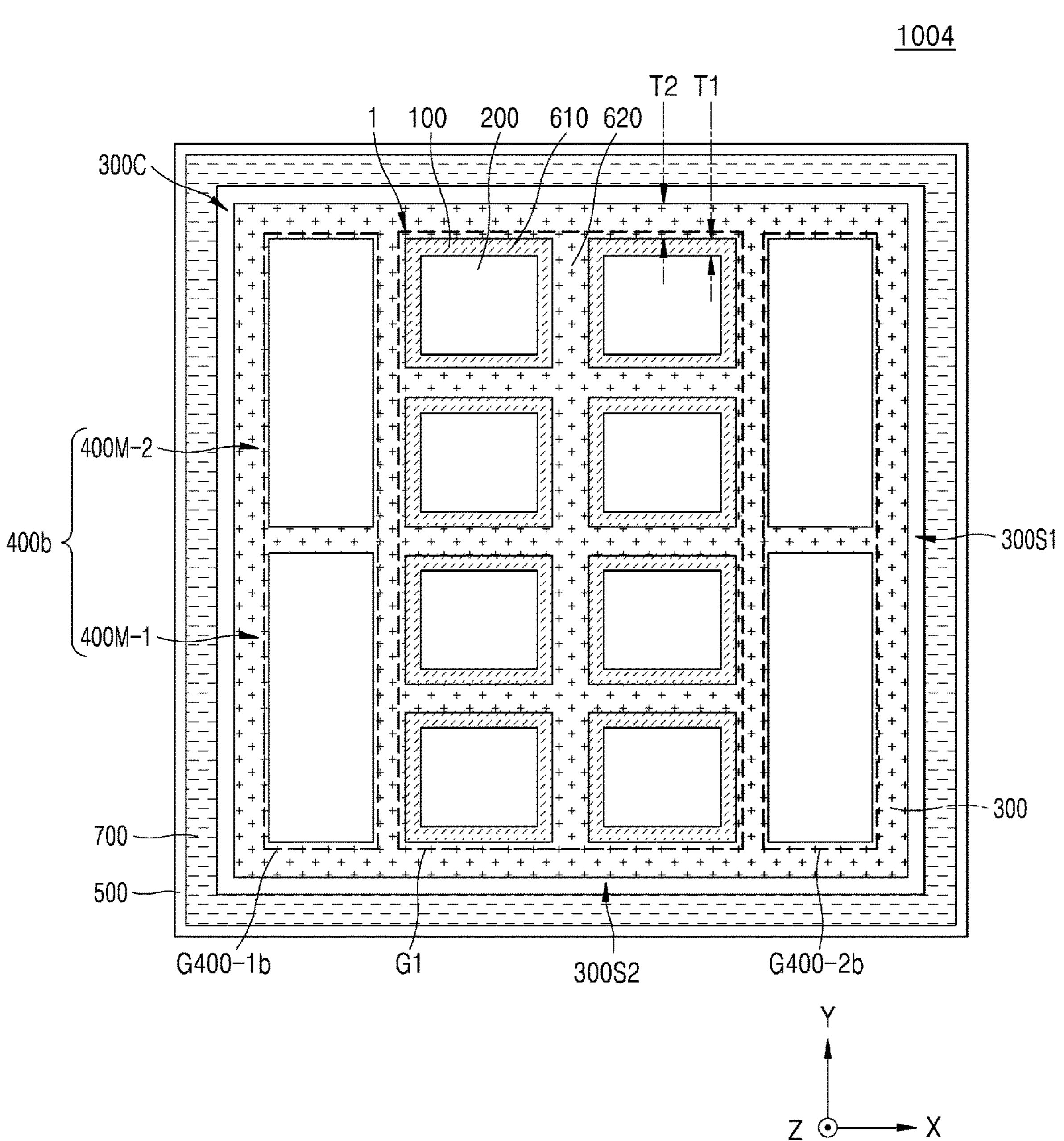
FIG. 5 is a plan view of a semiconductor package according to some embodiments.

FIG. 5 is a plan view of a semiconductor package according to some embodiments. In FIG. 5, the same reference numerals as in FIGS. 1 to 4B indicate the same components, and the content overlapping with FIGS. 1 to 4B may be omitted, and FIG. 5 may be described with reference to FIGS. 2A to 2C together.

Referring to FIG. 5, a semiconductor package 1004 includes the package base substrate 500, the interposer 300 attached to the package base substrate 500, at least one stacked structure 1 attached to the interposer 300, and a plurality of third semiconductor chips 400*b* attached to the interposer 300.

The plurality of third semiconductor chips 400*b* attached to the interposer 300 may form two groups including a first chip group G400-1*b* and a second chip group G400-2*b* having the at least one stacked structure 1 therebetween and apart from each other. On the interposer 300, the first chip group G400-1*b* and the second chip group G400-2*b* may have the at least one stacked structure 1 therebetween and may be apart from each other.

The plurality of third semiconductor chips 400*b* may include at least two first main semiconductor chips 400M-1 and at least two second main semiconductor chips 400M-2. In some embodiments, each of the first chip group G400-1*b* and the second chip group G400-2*b* may include the first main semiconductor chip 400M-1 and the second main semiconductor chip 400M-2.

On the interposer 300, the first chip group G400-1*b* and the second chip group G400-2*b* may have the stack structure group G1 therebetween and may be apart from each other.

In FIG. 5, a separation distance between the side surface of the stacked structure 1 adjacent to the pair of second edges 300S2 of the interposer 300 and the pair of second edges 300S2 may be the same as the separation distance between the side surface of the third semiconductor chip 400 adjacent to the pair of second edges 300S2 of the interposer 300 and the pair of second edges 300S2, but the present inventive concept is not limited thereto. For example, as shown in FIG. 3, the separation distance between the side surface of the stacked structure 1 adjacent to the pair of second edges 300S2 of the interposer 300 and the pair of second edges 300S2 may be greater than the separation distance between the side surface of the third semiconductor chip 400 adjacent to the pair of second edges 300S2 of the interposer 300 and the pair of second edges 300S2.

Figure 6A:
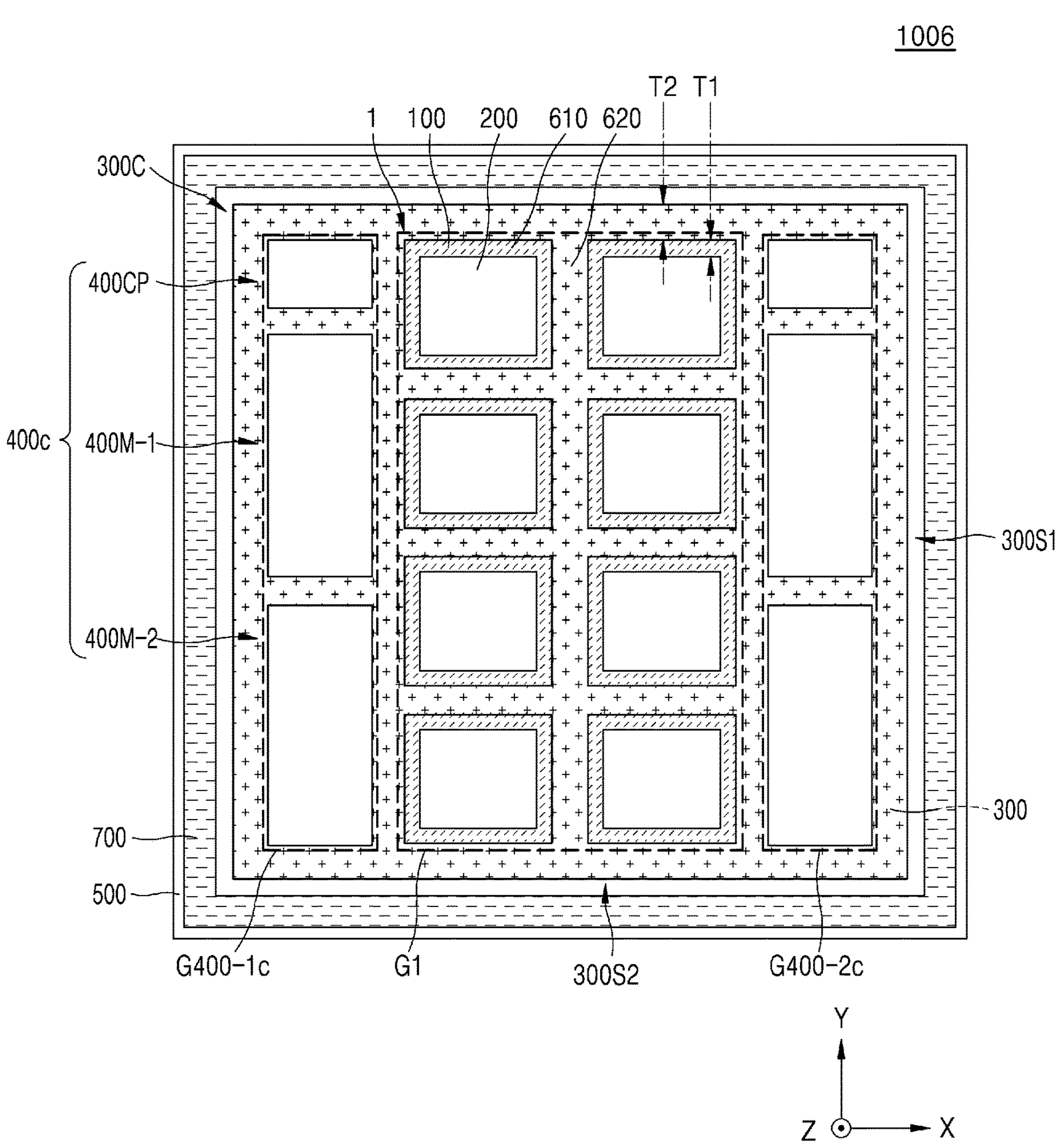
FIGS. 6A and 6B are plan views of a semiconductor package according to some embodiments.
Figure 6B:
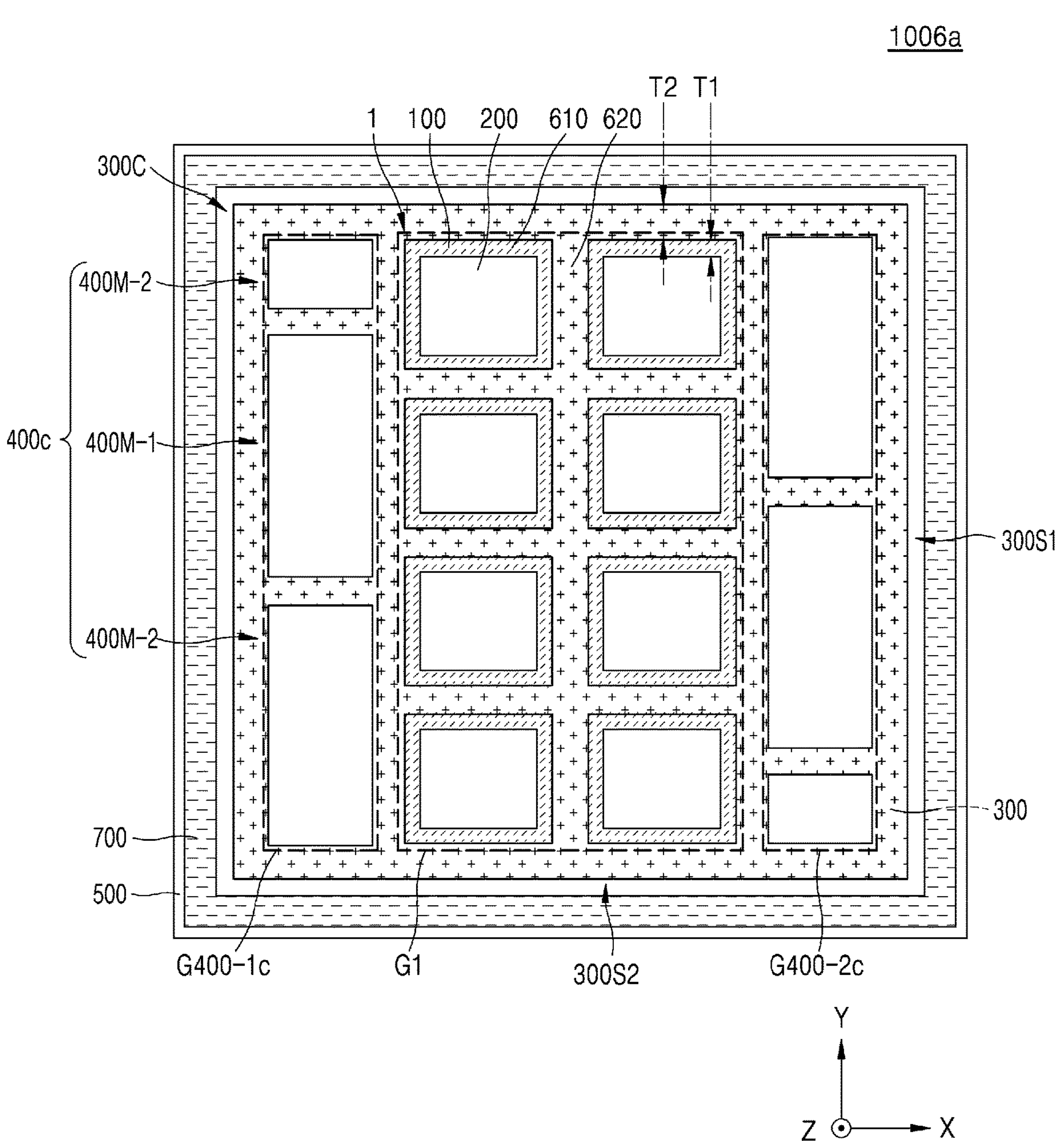

FIGS. 6A and 6B are plan views of a semiconductor package according to some embodiments. In FIGS. 6A and 6B, the same reference numerals as in FIGS. 1 to 5 indicate the same components, and the content overlapping with FIGS. 1 to 5 may be omitted, and FIGS. 6A and 6B may be described with reference to FIGS. 2A to 2C together.

Referring to FIG. 6A, a semiconductor package 1006 includes the package base substrate 500, the interposer 300 attached to the package base substrate 500, at least one stacked structure 1 attached to the interposer 300, and a plurality of third semiconductor chips 400*c* attached to the interposer 300.

The plurality of third semiconductor chips 400*c* attached to the interposer 300 may form two groups including a first chip group G400-1*c* and a second chip group G400-2*c* having the at least one stacked structure 1 therebetween and apart from each other. On the interposer 300, the first chip group G400-1*c* and the second chip group G400-2*c* may have the at least one stacked structure 1 therebetween and may be apart from each other.

The plurality of third semiconductor chips 400*c* may include the at least two first main semiconductor chips 400M-1, the at least two second main semiconductor chips 400M-2, and at least two chiplets 400CP. In some embodiments, each of the first chip group G400-1*c* and the second chip group G400-2*c* may include the first main semiconductor chip 400M-1, the second main semiconductor chip 400M-2, and the chiplet 400CP. In some embodiments, the chiplets 400CP respectively included in the first chip group G400-1*c* and the second chip group G400-2*c* may be arranged adjacent to the same second edge of the pair of second edges 300S2. On the interposer 300, the first chip group G400-1*c* and the second chip group G400-2*c* may have the stack structure group G1 therebetween and may be apart from each other.

In FIG. 6A, the separation distance between the side surface of the stacked structure 1 adjacent to the pair of second edges 300S2 of the interposer 300 and the pair of second edges 300S2 may be the same as the separation distance between the side surface of the third semiconductor chip 400 adjacent to the pair of second edges 300S2 of the interposer 300 and the pair of second edges 300S2, but the present inventive concept is not limited thereto. For example, as shown in FIG. 3, the separation distance between the side surface of the stacked structure 1 adjacent to the pair of second edges 300S2 of the interposer 300 and the pair of second edges 300S2 may be greater than the separation distance between the side surface of the third semiconductor chip 400 adjacent to the pair of second edges 300S2 of the interposer 300 and the pair of second edges 300S2.

Referring to FIG. 6B, a semiconductor package 1006*a* includes the package base substrate 500, the interposer 300 attached to the package base substrate 500, at least one stacked structure 1 attached to the interposer 300, and the plurality of third semiconductor chips 400*c* attached to the interposer 300.

The plurality of third semiconductor chips 400*c* attached to the interposer 300 may form two groups including the first chip group G400-1*c* and the second chip group G400-2*c* having the at least one stacked structure 1 therebetween and apart from each other. On the interposer 300, the first chip group G400-1*c* and the second chip group G400-2*c* may have the at least one stacked structure 1 therebetween and may be apart from each other.

The plurality of third semiconductor chips 400*c* may include the at least two first main semiconductor chips 400M-1, the at least two second main semiconductor chips 400M-2, and at least two chiplets 400CP. In some embodiments, each of the first chip group G400-1*c* and the second chip group G400-2*c* may include the first main semiconductor chip 400M-1, the second main semiconductor chip 400M-2, and the chiplet 400CP. In some embodiments, the chiplet 400CP included in each of the first chip group G400-1*c* and the second chip group G400-2*c* may be arranged adjacent to different second edges of the pair of second edges 300S2.

Figure 7A:
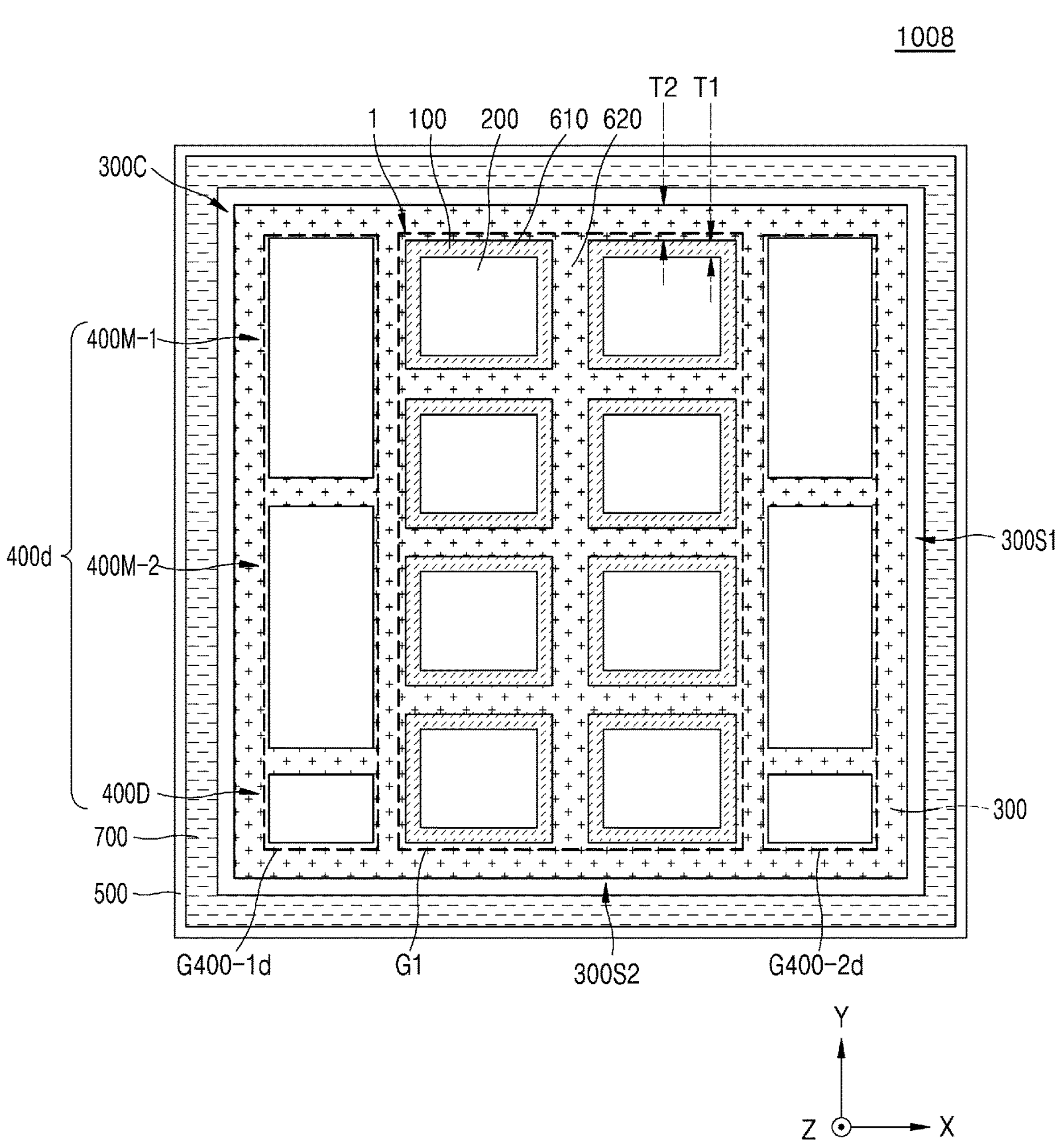
FIGS. 7A and 7B are plan views of a semiconductor package according to some embodiments.
Figure 7B:
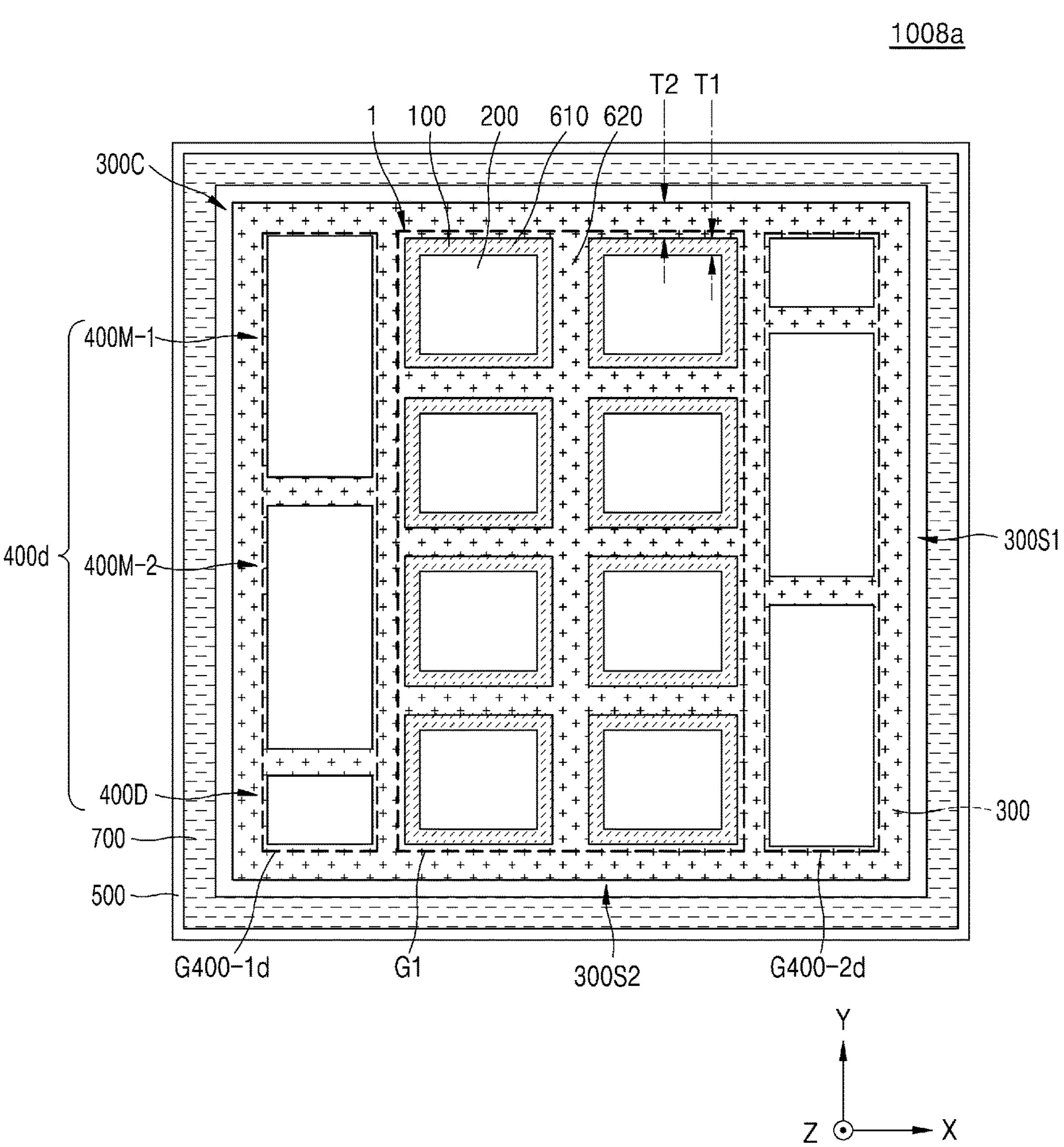

FIGS. 7A and 7B are plan views of a semiconductor package according to some embodiments. In FIGS. 7A and 7B, the same reference numerals as in FIGS. 1 to 6B indicate the same components, and the content overlapping with FIGS. 1 to 6B may be omitted, and FIGS. 7A and 7B may be described with reference to FIGS. 2A to 2C together.

Referring to FIG. 7A, a semiconductor package 1008 includes the package base substrate 500, the interposer 300 attached to the package base substrate 500, at least one stacked structure 1 attached to the interposer 300, and a plurality of third semiconductor chips 400*d* attached to the interposer 300.

The plurality of third semiconductor chips 400*d* attached to the interposer 300 may form two groups including a first chip group G400-1*d* and a second chip group G400-2*d* having the at least one stacked structure 1 therebetween and apart from each other. On the interposer 300, the first chip group G400-1*d* and the second chip group G400-2*d* may have the at least one stacked structure 1 therebetween and may be apart from each other.

The plurality of third semiconductor chips 400*d* may include the at least two first main semiconductor chips 400M-1, the at least two second main semiconductor chips 400M-2, and at least two dummy chips 400D. In some embodiments, each of the first chip group G400-1*d* and the second chip group G400-2*d* may include the first main semiconductor chip 400M-1, the second main semiconductor chip 400M-2, and the dummy chip 400D. In some embodiments, the dummy chips 400D respectively included in the first chip group G400-1*d* and the second chip group G400-2*d* may be arranged adjacent to the same second edge of the pair of second edges 300S2.

Referring to FIG. 7B, a semiconductor package 1008*a* includes the package base substrate 500, the interposer 300 attached to the package base substrate 500, at least one stacked structure 1 attached to the interposer 300, and the plurality of third semiconductor chips 400*d* attached to the interposer 300.

The plurality of third semiconductor chips 400*d* attached to the interposer 300 may form two groups including the first chip group G400-1*d* and the second chip group G400-2*d* having the at least one stacked structure 1 therebetween and apart from each other. On the interposer 300, the first chip group G400-1*d* and the second chip group G400-2*d* may have the at least one stacked structure 1 therebetween and may be apart from each other.

The plurality of third semiconductor chips 400*d* may include the at least two first main semiconductor chips 400M-1, the at least two second main semiconductor chips 400M-2, and the at least two dummy chips 400D. In some embodiments, each of the first chip group G400-1*d* and the second chip group G400-2*d* may include the first main semiconductor chip 400M-1, the second main semiconductor chip 400M-2, and the dummy chips 400D. In some embodiments, the dummy chips 400D respectively included in the first chip group G400-1*d* and the second chip group G400-2*d* may be arranged adjacent to different second edges of the pair of second edges 300S2.

Figure 8:
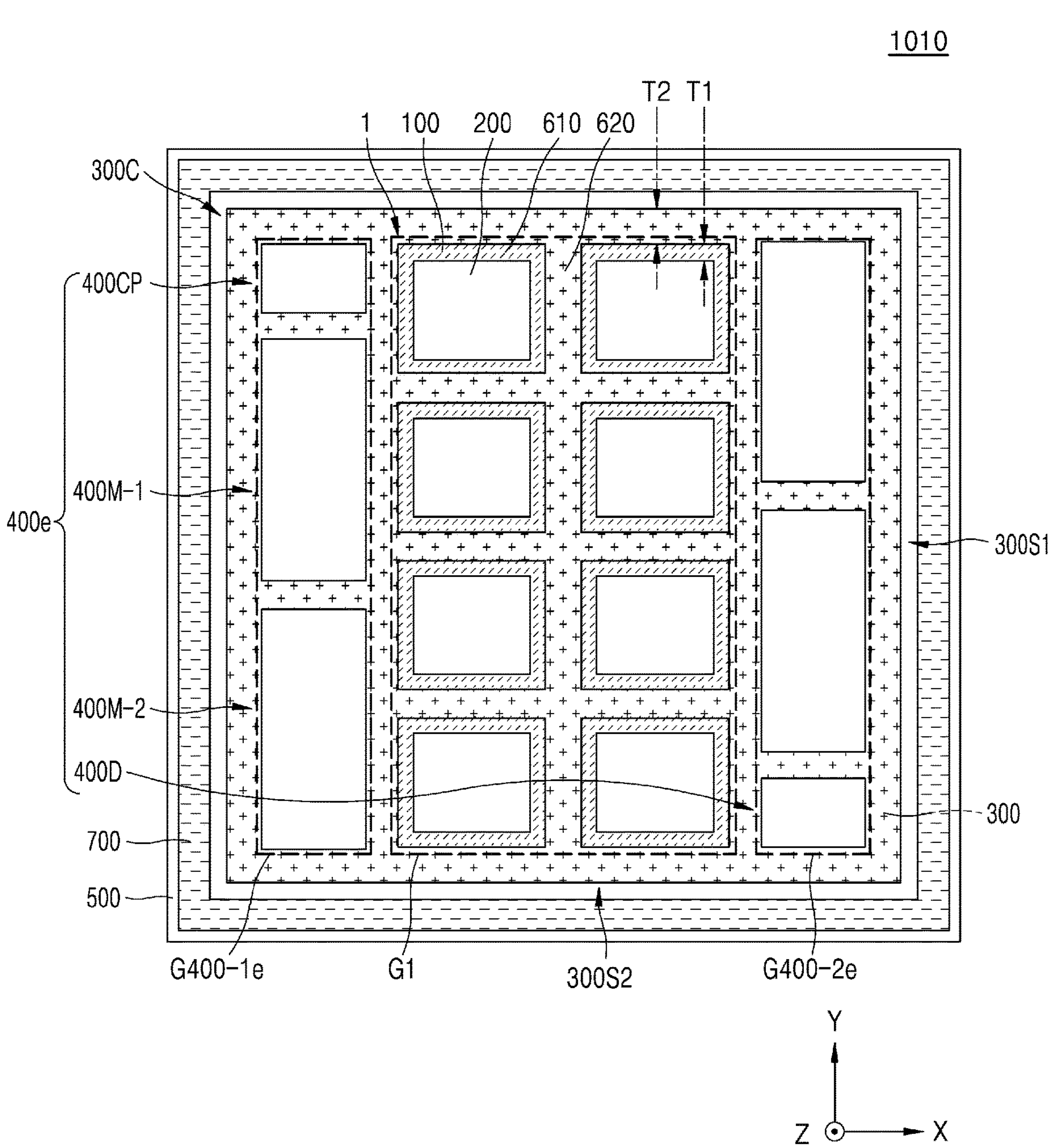
FIG. 8 is a plan view of a semiconductor package according to some embodiments.

FIG. 8 is a plan view of a semiconductor package according to some embodiments. In FIG. 8, the same reference numerals as in FIGS. 1 to 7B indicate the same components, and the content overlapping with FIGS. 1 to 7B may be omitted, and FIG. 8 may be described with reference to FIGS. 2A to 2C together.

Referring to FIG. 8, a semiconductor package 1010 includes the package base substrate 500, the interposer 300 attached to the package base substrate 500, at least one stacked structure 1 attached to the interposer 300, and a plurality of third semiconductor chips 400*e* attached to the interposer 300.

The plurality of third semiconductor chips 400*e* attached to the interposer 300 may form two groups including a first chip group G400-1*e* and a second chip group G400-2*e* having the at least one stacked structure 1 therebetween and apart from each other. On the interposer 300, the first chip group G400-1*e* and the second chip group G400-2*e* may have the at least one stacked structure 1 therebetween and may be apart from each other.

The plurality of third semiconductor chips 400*e* may include at least two first main semiconductor chips 400M-1, at least two second main semiconductor chips 400M-2, at least one chiplet 400CP, and at least one dummy chip 400D. In some embodiments, the first chip group G400-1*e* may include the first main semiconductor chip 400M-1, the second main semiconductor chip 400M-2, and the chiplet 400CP, and the second chip group G400-2*e* may include the first main semiconductor chip 400M-1, the second main semiconductor chip 400M-2, and the dummy chip 400D. In some embodiments, the chiplet 400CP included in the first chip group G400-1*e* and the dummy chip 400D included in the second chip group G400-2*e* may be arranged adjacent to different second edges of the pair of second edges 300S2, but are not limited thereto. For example, the chiplet 400CP included in the first chip group G400-1*e* and the dummy chip 400D included in the second chip group G400-2*e* may be arranged to be adjacent to the same second edge of the pair of second edges 300S2.

FIGS. 9A to 9D are cross-sectional views illustrating a method of manufacturing a semiconductor package according to some embodiments.

Figure 9A:
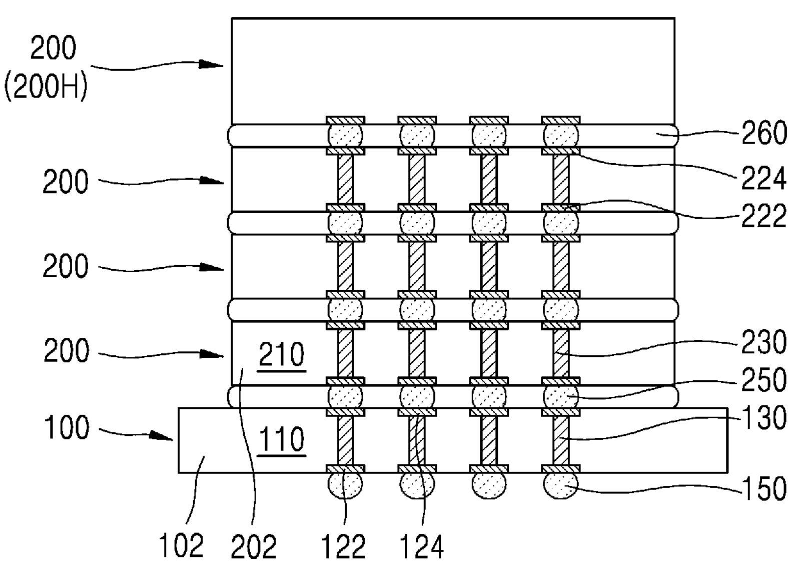
FIGS. 9A to 9D are cross-sectional views illustrating operations for manufacturing a semiconductor package according to some embodiments.
Figure 9A:
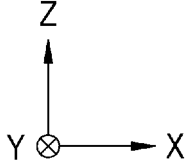

Referring to FIG. 9A, the plurality of second semiconductor chips 200 are sequentially stacked on the first semiconductor chip 100. The plurality of second semiconductor chips 200 may be sequentially stacked on the first semiconductor chip 100 after the insulating adhesive layer 260 is attached to a lower surface of the plurality of second semiconductor chips 200.

The plurality of second chip connection terminals 250 may be interposed between the plurality of first rear connection pads 124 of the first semiconductor chip 100 and the plurality of second front connection pads 222 of the lowermost second semiconductor chip 200 from among the plurality of second semiconductor chips 200, and between the plurality of second front connection pads 222 of the remaining second semiconductor chips 200 from among the plurality of second semiconductor chips 200 and the plurality of second rear connection pads 224 of the other second semiconductor chip 200 thereunder.

The plurality of first chip connection terminals 150 may be attached to the plurality of first front connection pads 122, but the present inventive concept is not limited thereto. For example, the plurality of first chip connection terminals 150 may be attached to the plurality of first front connection pads 122 after the chip molding layer 610 shown in FIG. 9B is formed.

Figure 9B:
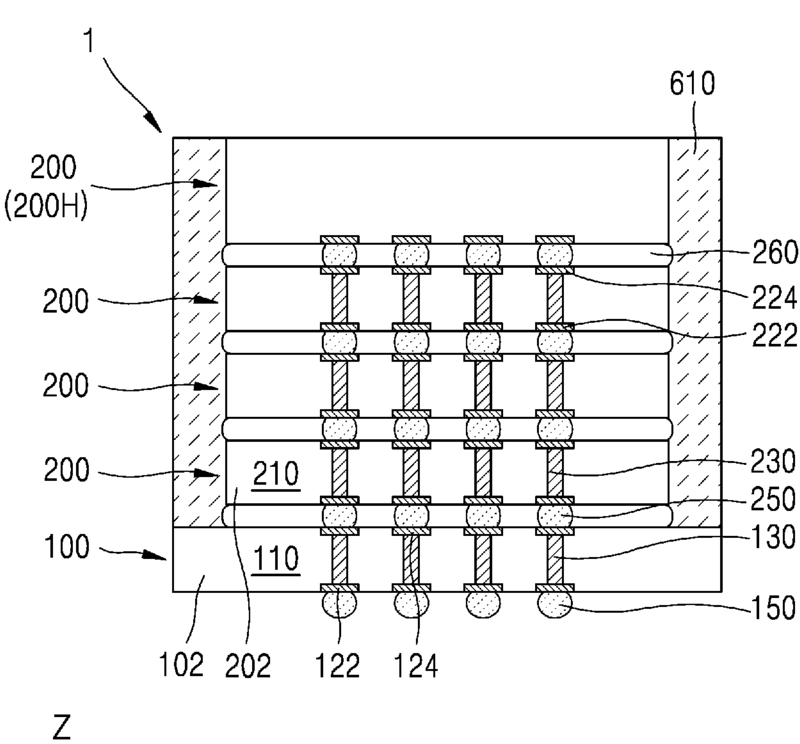

Referring to FIG. 9B, the chip molding layer 610 surrounding the plurality of second semiconductor chips 200 and the plurality of insulating adhesive layers 260 is formed on the first semiconductor chip 100, and the stacked structure 1 including the first semiconductor chip 100, the plurality of second semiconductor chips 200, and the chip molding layer 610 is formed. The chip molding layer 610 may be formed such that the side surface of the first semiconductor chip 100 and the side surface of the chip molding layer 610 corresponding to each other are aligned in the vertical direction (the Z direction) to be flush with each other, as illustrated.

Figure 9C:
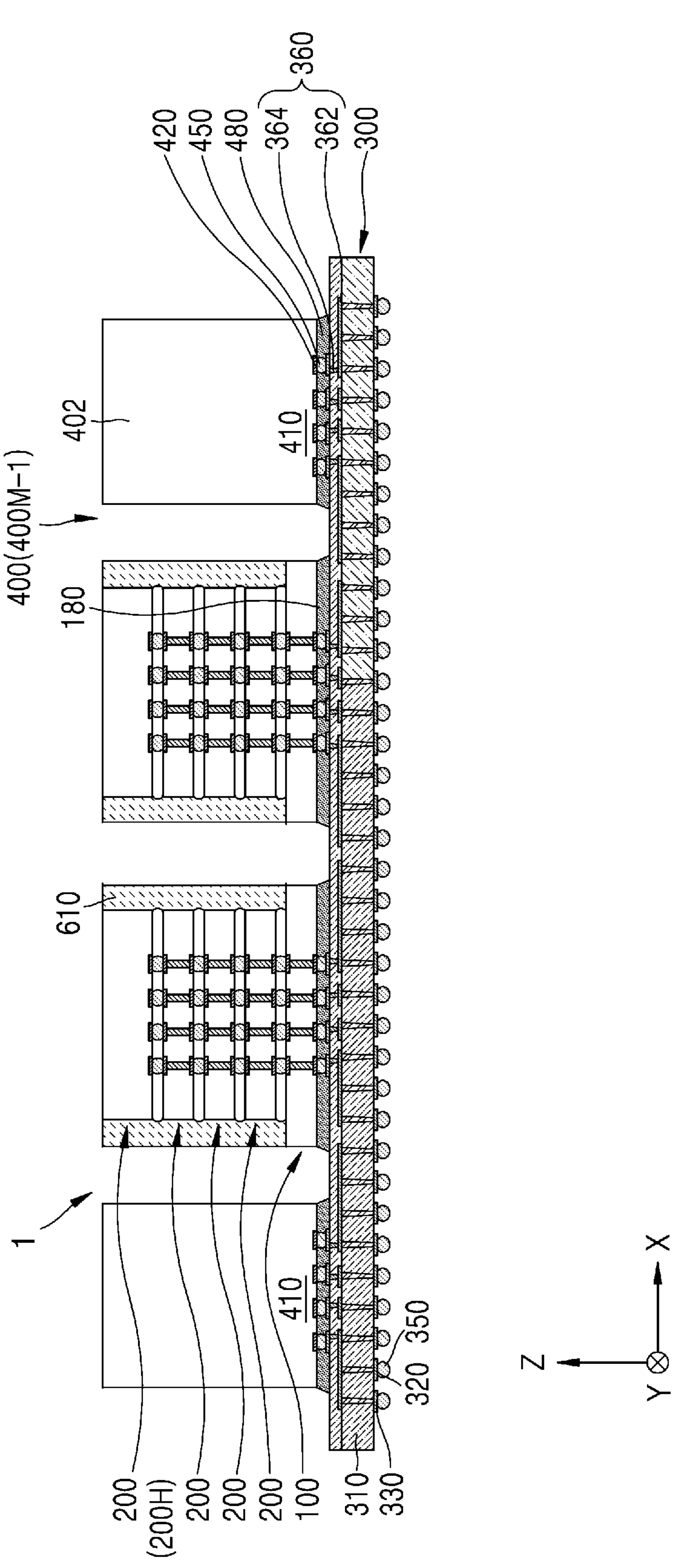

Referring to FIG. 9C, at least one stacked structure 1 including the first semiconductor chip 100 and the plurality of second semiconductor chips 200 stacked on the first semiconductor chip 100, and at least one of the third semiconductor chip 400 are attached on the interposer 300.

The at least one stacked structure 1 and the at least one third semiconductor chip 400 may be attached to the interposer 300 such that the plurality of first chip connection terminals 150 are interposed between the plurality of first front connection pads 122 and the plurality of interposer upper pads from among the plurality of interposer wiring line patterns 362 and the plurality of third chip connection terminals 450 are interposed between the plurality of third front connection pads 420 and the plurality of interposer upper pads from among the plurality of interposer wiring line patterns 362.

The first underfill layer 180 surrounding the plurality of first chip connection terminals 150 may be formed between the interposer 300 and the stacked structure 1, and the second underfill layer 480 surrounding the plurality of third chip connection terminals 450 may be formed between the interposer 300 and the third semiconductor chip 400.

Figure 9D:
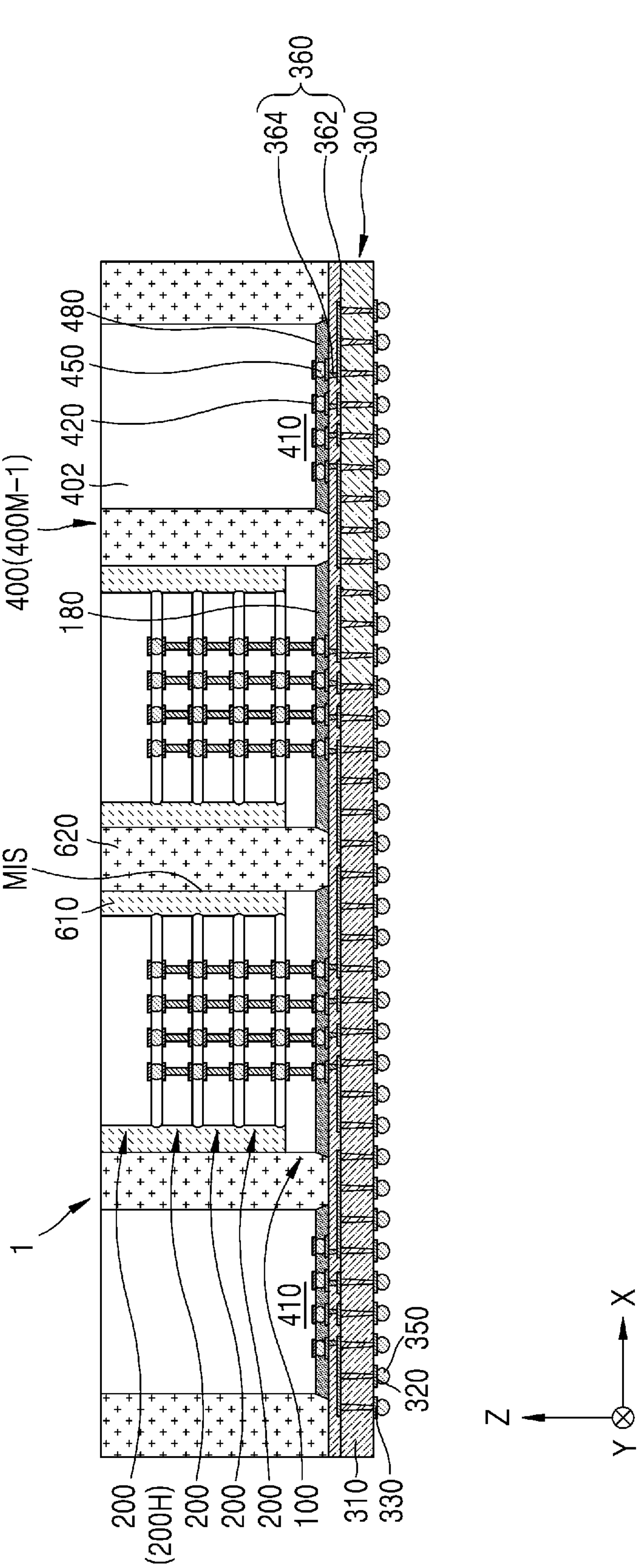

Referring to FIG. 9D, the package molding layer 620 surrounding the at least one stacked structure 1 and the plurality of third semiconductor chips 400 is formed on the interposer 300. A molding interface MIS may be formed between the chip molding layer 610 and the package molding layer 620.

Thereafter, the interposer 300 may be attached on the package base substrate 500 shown in FIGS. 2A to 2C to form the semiconductor package 1000.

Referring to FIGS. 1 to 9D together, in the method of manufacturing the semiconductor package 1000 according to the present inventive concept, the package molding layer 620 surrounding the at least one stacked structure 1 and the plurality of third semiconductor chips 400 is formed on the interposer 300. Therefore, even if the molding interface MIS is formed between the chip molding layer 610 and the package molding layer 620, the molding interface MIS is relatively apart from the corner 300C and the edges 300S1 and 300S2 of the interposer 300. Accordingly, the semiconductor package 1000 according to the present inventive concept may minimize warpage of the interposer 300 due to the molding interface MIS between the chip molding layer 610 and the package molding layer 620, and thus, may provide structural reliability of the semiconductor package 1000 and connection reliability between the interposer 300 and the package base substrate 500.

Figure 10:
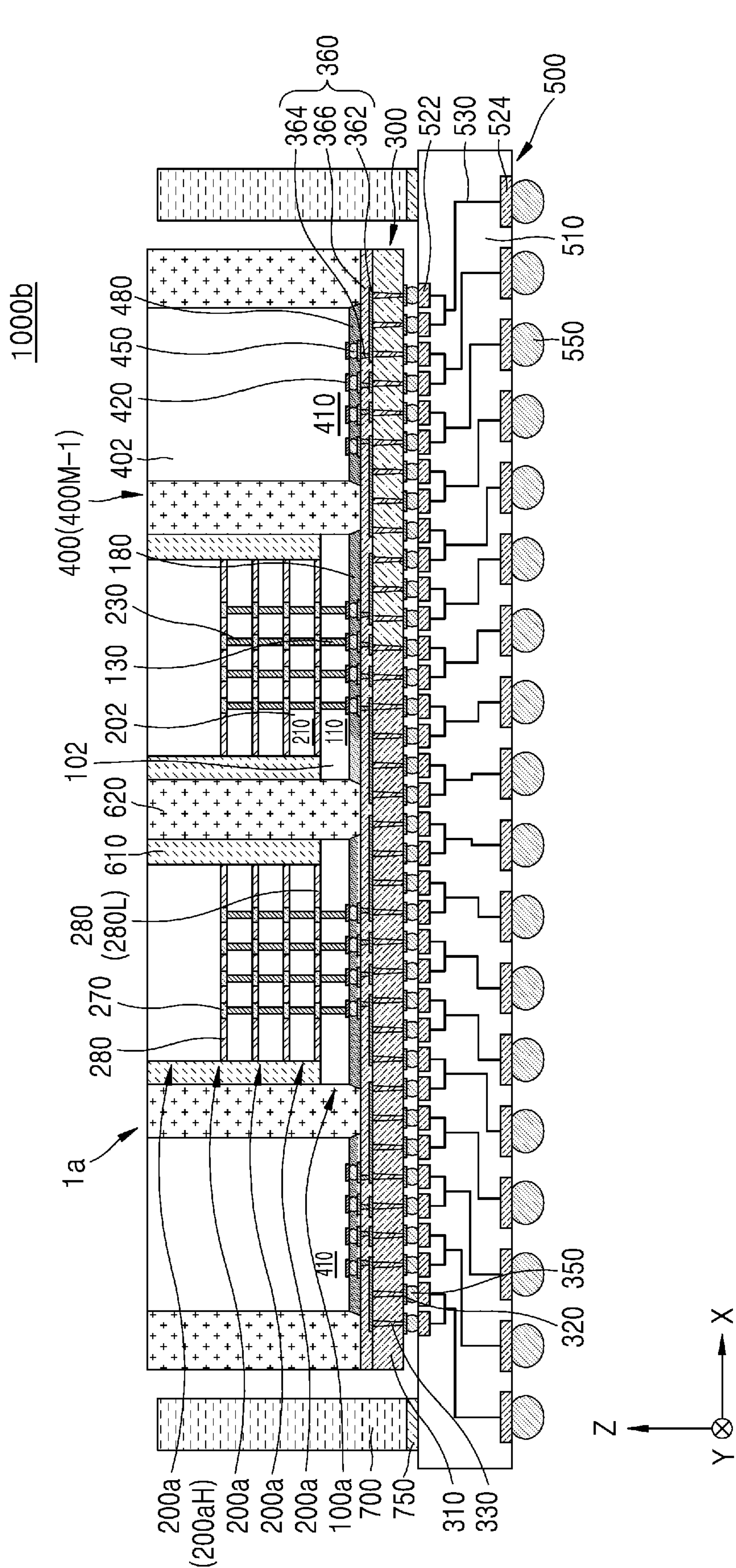
FIG. 10 is a cross-sectional view of a semiconductor package according to some embodiments.

FIG. 10 is a cross-sectional view of a semiconductor package according to some embodiments. In FIG. 10, the same reference numerals as in FIGS. 1 to 8 indicate the same components, and the content overlapping with FIGS. 1 to 8 may be omitted.

Referring to FIG. 10, the semiconductor package 1000*b* includes the package base substrate 500, the interposer 300 attached to the package base substrate 500, at least one stacked structure 1*a* attached on the interposer 300 and including a first semiconductor chip 100*a* and a plurality of second semiconductor chips 200*a* stacked on the first semiconductor chip 100*a*, and the plurality of third semiconductor chips 400 attached to the interposer 300. The at least one stacked structure 1*a* and the plurality of third semiconductor chips 400 may be apart from each other in a horizontal direction and may be attached to the interposer 300.

The first semiconductor chip 100*a* includes the first substrate 102 and the plurality of first through-electrodes 130, and a second semiconductor chip 200*a* includes a second substrate 202 and a plurality of second through-electrodes 230.

The stacked structure 1*a* may include the first semiconductor chip 100*a* and the plurality of second semiconductor chips 200*a*. The plurality of second semiconductor chips 200*a* may be sequentially stacked on the first semiconductor chip 100*a* in a vertical direction. The first semiconductor chip 100*a* may be electrically connected to the plurality of second semiconductor chips 200*a* through a plurality of bonding pads 270 to exchange signals and provide power and ground. For example, a plurality of bonding pads 270 may be interposed between the first semiconductor chip 100*a* and a lowermost second semiconductor chip 200*a* and between two adjacent second semiconductor chips 200*a* from among the plurality of second semiconductor chips 200*a*.

For example, the plurality of bonding pads 270 may include a material including Cu. The plurality of bonding pads 270 may be electrically connected to the plurality of first through-electrodes 130 and the plurality of second through-electrodes 230.

Between the first semiconductor chip 100*a* and the plurality of second semiconductor chips 200*a*, that is, between the first semiconductor chip 100*a* and the lowermost second semiconductor chip 200*a*, and between the plurality of second semiconductor chips 200*a*, the plurality of bonding pads 270 may be surrounded by a chip bonding insulating layer 280, respectively. The plurality of bonding pads 270 may penetrate the chip bonding insulating layer 280. Each of a plurality of chip bonding insulating layers 280 may be between the first semiconductor chip 100*a* and the plurality of second semiconductor chips 200*a*.

After forming conductive material layers on surfaces facing each other of two adjacent chips from among the first semiconductor chip 100*a* and the plurality of second semiconductor chips 200*a*, respectively, each of the plurality of bonding pads 270 may be formed by diffusion bonding such that the conductive material layers facing each other expand by heat to contact each other and be integrated through diffusion of metal atoms therein.

After forming conductive material layers on surfaces facing each other of two adjacent chips from among the first semiconductor chip 100*a* and the plurality of second semiconductor chips 200*a*, respectively, in a process of forming the plurality of bonding pads 270, the chip bonding insulating layer 280 may be formed by diffusion bonding such that the conductive material layers facing each other expand by heat to contact each other and be integrated through diffusion of atoms therein.

A lowermost chip bonding insulating layer 280L interposed between the first semiconductor chip 100*a* and the lowermost second semiconductor chip 200*a* from among the plurality of chip bonding insulating layers 280 may be formed by diffusion bonding an insulating material layer covering an upper surface of the first semiconductor chip 100*a* and an insulating material layer covering a lower surface of the lowermost second semiconductor chip 200*a*.

The lowermost chip bonding insulating layer 280L may have a recess 280R (FIG. 11B) in an upper portion thereof such that a thickness of a portion overlapping the lowermost second semiconductor chip 200*a* in a vertical direction is greater than that of a portion not vertically overlapping with the lowermost second semiconductor chip 200*a*. The recess 280R may be located in a portion that does not vertically overlap with the lowermost second semiconductor chip 200*a* from among the lowermost chip bonding insulating layer 280L. The lowermost chip bonding insulating layer 280L may have a shape in which a center portion, that is, a portion that vertically overlaps with the lowermost second semiconductor chip 200*a* protrudes upward than an edge portion, that is, a portion that does not vertically overlap with the lowermost second semiconductor chip 200*a*, and may have a flat lower surface.

The lowermost chip bonding insulating layer 280L may cover all of the upper surface of the first semiconductor chip 100*a* that vertically overlap with the lowermost second semiconductor chip 200*a*. A portion of the upper surface of the first semiconductor chip 100*a* vertically overlapping with the lowermost second semiconductor chip 200*a* and a portion of the lower surface of the lowermost second semiconductor chip 200*a* may be covered by the plurality of bonding pads 270, and the remaining portion may be covered by the lowermost chip bonding insulating layer 280L.

The remaining chip bonding insulating layer 280 excluding the lowermost chip bonding insulating layer 280L may cover both upper and lower surfaces of the second semiconductor chip 200*a* facing each other together with the plurality of bonding pads 270. The remaining chip bonding insulating layer 280 excluding the lowermost chip bonding insulating layer 280L may have upper and lower surfaces to have substantially the same thickness.

The chip bonding insulating layer 280 may include any one of SiO, SiN, SiCN, SiCO, and a polymer material. The polymer material may be benzocyclobutene (BCB), polyimide (PI), polybenzoxazole (PBO), silicone, acrylate, or epoxy. For example, the chip bonding insulating layer 280 may include silicon oxide. The chip bonding insulating layer 280 may have a thickness of, for example, about 100 nm to about 1 μm.

The stacked structure 1*a* may further include the chip molding layer 610 surrounding the plurality of second semiconductor chips 200*a* and the plurality of chip bonding insulating layers 280 on the first semiconductor chip 100*a*. In some embodiments, the chip molding layer 610 may cover a side surface of the plurality of second semiconductor chips 200*a*, but may expose an upper surface of a second semiconductor chip 200*a*H on the top without covering it.

Figure 11A:
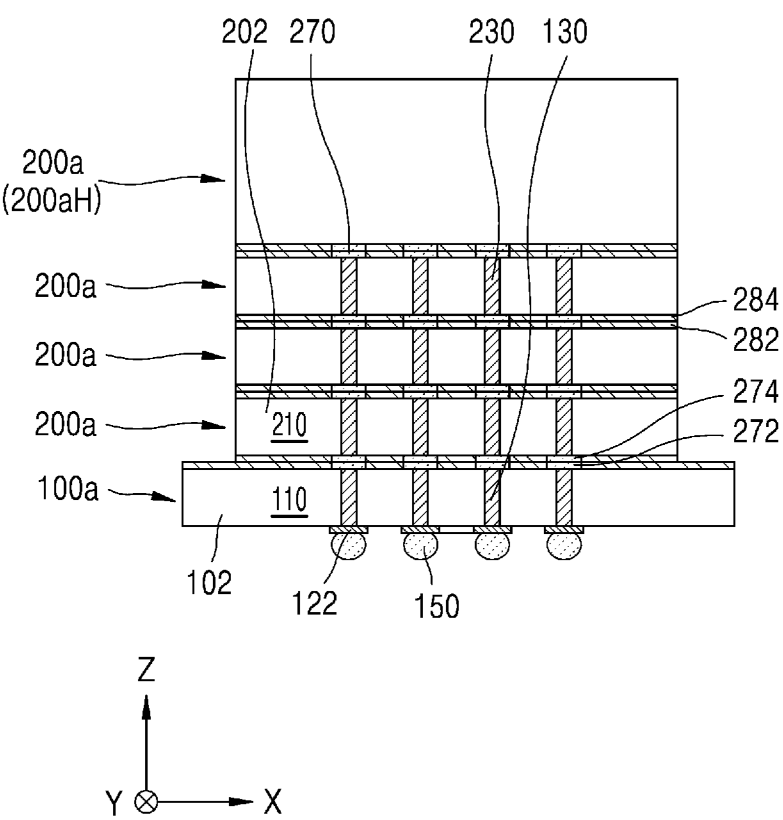
FIGS. 11A and 11B are cross-sectional views illustrating operations for manufacturing a semiconductor package according to some embodiments.
Figure 11B:
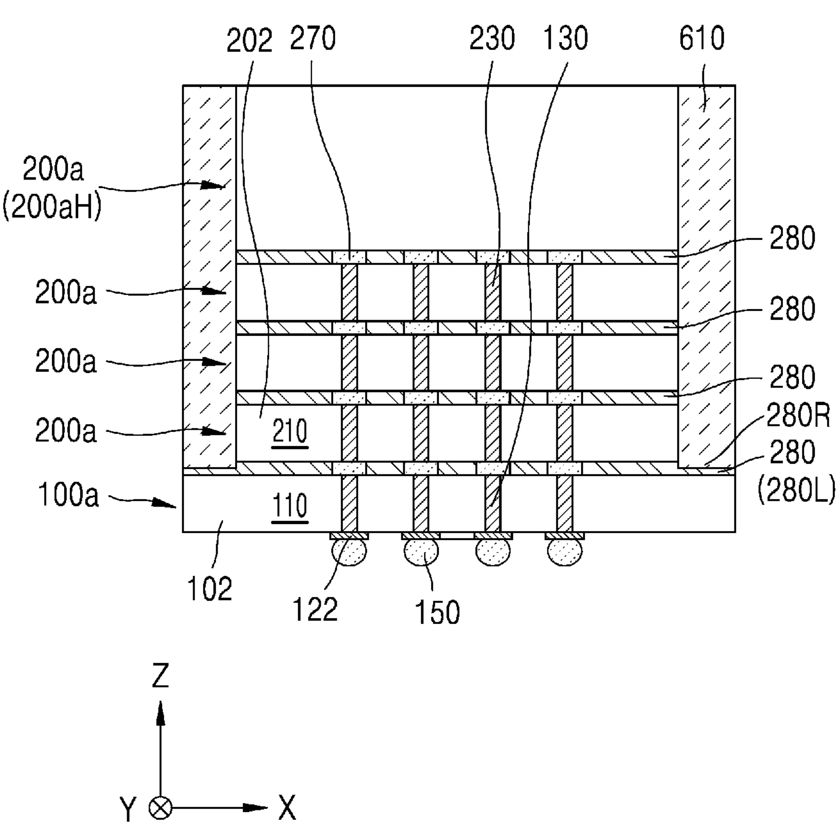

FIGS. 11A and 11B are cross-sectional views illustrating a method of manufacturing a semiconductor package according to some embodiments.

Referring to FIG. 11A, after forming a plurality of first chip connection pads 272 and a first chip bonding insulating material layer 282 on the first semiconductor chip 100*a* and the upper surface of the second semiconductor chip 200*a*, and after forming a plurality of second chip connection pads 274 and a second chip bonding insulating material layer 284 below the second semiconductor chip 200*a*, the plurality of second semiconductor chips 200*a* are sequentially stacked on the first semiconductor chip 100*a*. In some embodiments, the plurality of first chip connection pads 272 and the first chip bonding insulating material layer 282 may not be formed on the uppermost second semiconductor chip 200*a*H from among the plurality of second semiconductor chips 200*a*.

Each of the plurality of second semiconductor chips 200*a* may be on the first semiconductor chip 100*a* or the lower second semiconductor chip 200*a* such that the plurality of second chip connection pads 274 correspond to the plurality of first chip connection pads 272 formed on the first semiconductor chip 100*a* or the lower second semiconductor chip 200*a*.

The plurality of first chip connection pads 272 may be arranged on the first semiconductor chip 100*a* and the second semiconductor chip 200*a* to be connected to the plurality of first through-electrodes 130 and the plurality of second through-electrodes 230. The first chip bonding insulating material layer 282 may be formed to surround a side surface of the plurality of first chip connection pads 272 on the first semiconductor chip 100*a* and on the second semiconductor chip 200*a*.

The plurality of second chip connection pads 274 may be below the plurality of second semiconductor chips 200*a*. The second chip bonding insulating material layer 284 may be formed to surround a side surface of the plurality of second chip connection pads 274 below the plurality of second semiconductor chips 200*a*.

Referring to FIG. 10, heat and/or pressure is applied in a process of placing the plurality of second semiconductor chips 200*a* on the first semiconductor chip 100*a* to bond the plurality of first chip connection pads 272 and the plurality of second chip connection pads 274 and bond the first chip bonding insulating material layer 282 and the second chip bonding insulating material layer 284. In some embodiments, the plurality of first chip connection pads 272 and the plurality of second chip connection pads 274, and the first chip bonding insulating material layer 282 and the second chip bonding insulating material layer 284 may be bonded to each other by forming a covalent bond.

Thereafter, by applying heat at a second temperature higher than the first temperature, the plurality of bonding pads 270 in which the plurality of first chip connection pads 272 and the plurality of second chip connection pads 274 corresponding to each other are bonded to each other, and the chip bonding insulating layer 280 in which the first chip bonding insulating material layer 282 and the second chip bonding insulating material layer 284 are bonded to each other may be formed. The plurality of first chip connection pads 272 and the plurality of second chip connection pads 274 corresponding to each other may be expanded by heat to meet each other, and then become the plurality of bonding pads 270 that are diffusion-bonded to form an integral body through diffusion of metal atoms therein.

In FIG. 10, the plurality of bonding pads 270 and the chip bonding insulating layer 280 respectively interposed between the first semiconductor chip 100*a* and the plurality of second semiconductor chips 200*a* are simultaneously formed, but this is for convenience of illustration and is not limited thereto. For example, in a process of sequentially stacking the plurality of second semiconductor chips 200*a* on the first semiconductor chip 100*a*, whenever one second semiconductor chip 200*a* is stacked, by repeating a process of forming the plurality of bonding pads 270 in which the plurality of first chip connection pads 272 and the plurality of second chip connection pads 274 corresponding to each other are bonded to each other, and the chip bonding insulating layer 280 in which the first chip bonding insulating material layer 282 and the second chip bonding insulating material layer 284 are bonded to each other, the plurality of bonding pads 270 and the chip bonding insulating layer 280 respectively interposed between the first semiconductor chip 100*a* and the plurality of second semiconductor chips 200*a* may be formed.

Thereafter, by forming the chip molding layer 610 surrounding the plurality of second semiconductor chips 200*a* and the plurality of chip bonding insulating layers 280 on the first semiconductor chip 100*a*, the stacked structure 1*a* including the first semiconductor chip 100*a*, the plurality of second semiconductor chips 200*a*, and the chip molding layer 610 is formed. A chip molding layer 610*a* may be formed such that a side surface of the first semiconductor chip 100*a* and a side surface of the chip molding layer 610 corresponding to each other are aligned in the vertical direction (the Z direction) to be flush with each other.

Thereafter, referring to FIGS. 9C and 9D, a semiconductor package 1000*b* shown in FIG. 10 may be formed.

Figure 12:
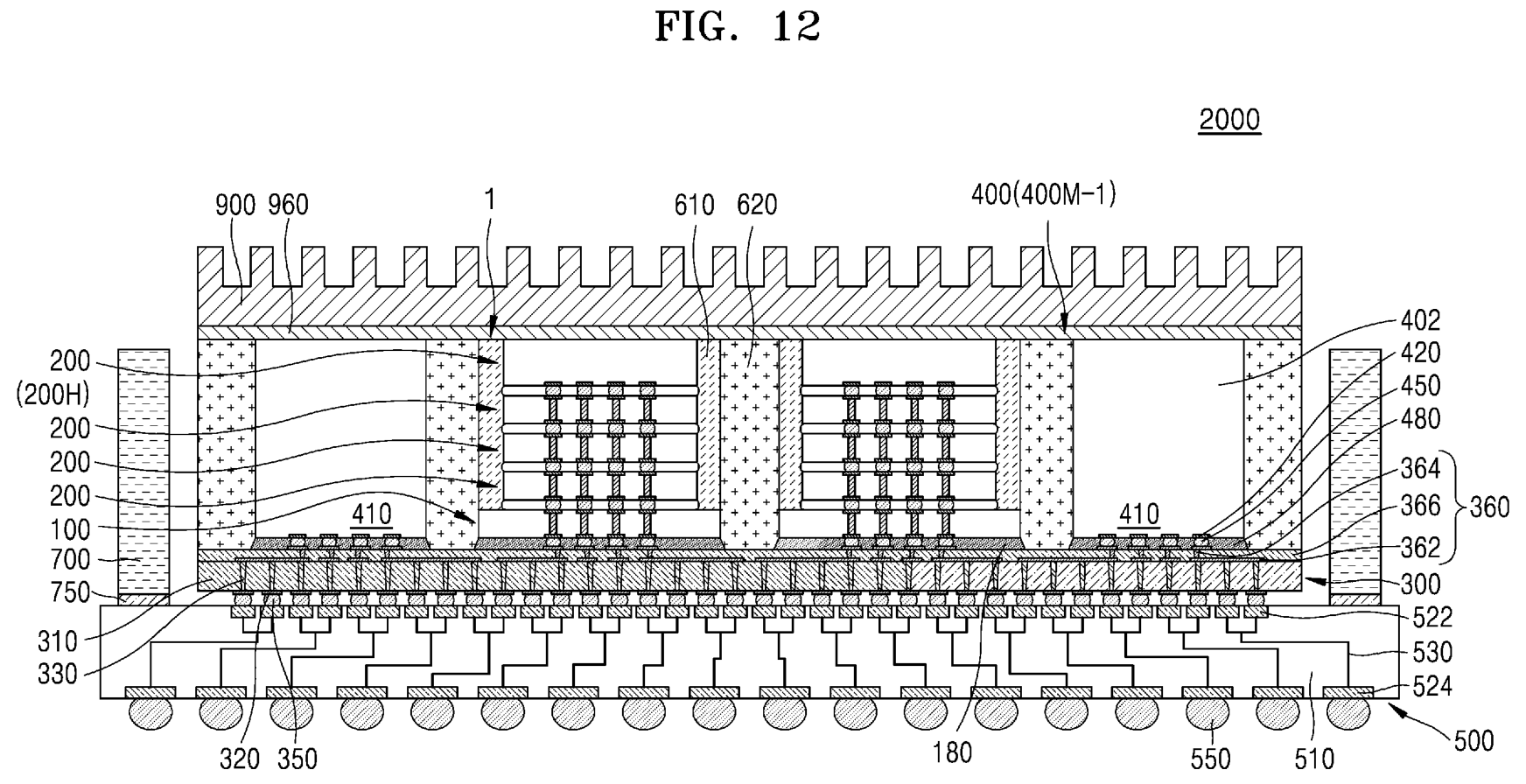

FIG. 12 is a cross-sectional view of a semiconductor package according to some embodiments.

Referring to FIG. 12, a semiconductor package 2000 may further include the package base substrate 500, the interposer 300 attached to the package base substrate 500, at least one stacked structure 1 attached on the interposer 300 and including the first semiconductor chip 100 and the plurality of second semiconductor chips 200 stacked on the first semiconductor chip 100, the plurality of third semiconductor chips 400 attached to the interposer 300, and a heat dissipation member 900 attached to the at least one stacked structure 1 and the plurality of third semiconductor chips 400. The heat dissipation member 900 may have a thermal interface material (TIM) 960 therebelow and may be attached to the at least one stacked structure 1 and the plurality of third semiconductor chips 400.

The TIM 960 may include an insulating material or a material capable of maintaining electrical insulation including the insulating material. The TIM 960 may include, for example, an epoxy resin. The TIM 960 may be, for example, mineral oil, grease, gap filler putty, phase change gel, phase change material pads, or a particle-filled epoxy.

The heat dissipation member 900 may be, for example, a heat sink, a heat spreader, a heat pipe, or a liquid cooled cold plate.

The semiconductor package 2000 shown in FIG. 12 is illustrated in that the semiconductor package 1000 shown in FIGS. 1 to 2C further includes the heat dissipation member 900, but is not limited thereto. For example, instead of the semiconductor package 1000 shown in FIGS. 1 to 2C, the semiconductor package 2000 may be configured such that the semiconductor packages 1000*a*, 1002, 1002*a*, 1004, 1006, 1006*a*, 1008, 1008*a*, 1010, and 1000*b* shown in FIGS. 3, 4A, 4B, 5, 6A, 6B, 7A, 7B, 8, and 10 further include the heat dissipation member 900.

While the present inventive concept has been particularly shown and described with reference to example embodiments thereof, it will be understood that various changes in form and details may be made therein without departing from the scope of the following claims.

What is claimed is:

1. A semiconductor package comprising:

an interposer comprising a base layer and a plurality of through-electrodes penetrating the base layer;

at least one stacked structure attached to the interposer, the at least one stacked structure comprising a first semiconductor chip, a plurality of second semiconductor chips sequentially stacked on the first semiconductor chip, and a chip molding layer on a side surface of the plurality of second semiconductor chips, the plurality of second semiconductor chips comprise high-bandwidth memory (HBM);

a plurality of third semiconductor chips attached to the interposer adjacent the at least one stacked structure; and a package molding layer extending around the at least one stacked structure and the plurality of third semiconductor chips, wherein the plurality of third semiconductor chips comprise a first chip group and a second chip group, the at least one stacked structure is between the first chip group and the second chip group, the first chip group and the second chip group comprise a plurality of functional blocks of central processing unit (CPU), graphics processing unit (GPU), and/or application-specific integrated circuit (ASIC) processing circuitry of one system-on-chip (SoC).

2. The semiconductor package of claim 1, wherein the interposer comprises a pair of first edges opposite to each other in a first direction and a pair of second edges opposite to each other in a second direction orthogonal to the first direction, the first chip group is adjacent to one of the first edges, and the second chip group is adjacent to the other one of the first edges, and the first chip group, the at least one stacked structure, and the second chip group are sequentially arranged along the first direction.

3. The semiconductor package of claim 2, wherein the first chip group includes at least two different semiconductor chips comprising respective functional blocks of the plurality of functional blocks, and the second chip group includes at least two different semiconductor chips comprising respective functional blocks of the plurality of functional blocks, and the semiconductor chips in the first chip group are arranged in a row adjacent to one of the first edges, and the semiconductor chips in the second chip group are arranged in a row adjacent to the other one of the first edges.

4. The semiconductor package of claim 2, wherein the plurality of third semiconductor chips include at least two main semiconductor chips having a plurality of functional blocks and at least one chiplet having one functional block.

5. The semiconductor package of claim 4, wherein the at least one chiplet in the first chip group and the at least one chiplet in the second chip group are adjacent to a same one of the second edges.

6. The semiconductor package of claim 4, wherein the at least one chiplet in the first chip group is adjacent to one of the second edges and the at least one chiplet in the second chip group is adjacent to the other one of the second edges.

7. The semiconductor package of claim 2, wherein a side surface of the at least one stacked structure adjacent to one of the second edges is not closer to the one of the second edges than a side surface of a third semiconductor chip adjacent to the one of the second edges.

8. The semiconductor package of claim 7, wherein the side surface of the at least one stacked structure and the side surface of the third semiconductor chip are equidistant from the one of the second edges.

9. The semiconductor package of claim 7, wherein the side surface of the third semiconductor chip and the side surface of the at least one stacked structure are not equidistant from the one of the second edges.

10. The semiconductor package of claim 1, wherein each of the first chip group, the second chip group, and the at least one stacked structure has a rectangular footprint.

11. A semiconductor package comprising:

an interposer comprising a base layer and a plurality of through-electrodes penetrating the base layer, the base layer comprising silicon, and the interposer having a pair of first edges opposite to each other in a first direction and a pair of second edges opposite to each other in a second direction orthogonal to the first direction;

a stacked structure group attached to the interposer, the stacked structure group comprising a plurality of stacked structures, each stacked structure comprising a first semiconductor chip, a plurality of second semiconductor chips sequentially stacked on the first semiconductor chip, and a chip molding layer on a side surface of the plurality of second semiconductor chips;

a plurality of third semiconductor chips attached to the interposer adjacent the stacked structure group, one of the plurality of third semiconductor chips being longer, in the second direction, than the first semiconductor chips and the pluralities of second semiconductor chips of the plurality of stacked structures; and a package molding layer on the interposer, the package molding layer extending around the stacked structure group and the plurality of third semiconductor chips to form a molding interface with the chip molding layer, wherein the plurality of third semiconductor chips comprise a first chip group arranged in a row along one of the first edges, and a second chip group arranged in a row along the other one of the first edges, and wherein the stacked structure group is spaced apart from each of the first edges.

12. The semiconductor package of claim 11, wherein the first chip group, the stacked structure group, and the second chip group are sequentially arranged along the first direction.

13. The semiconductor package of claim 11, wherein the molding interface is not closer to one of the second edges than a side surface of the third semiconductor chip adjacent to the one of the second edges.

14. The semiconductor package of claim 11, wherein the chip molding layer has a first thickness in the second direction from a side surface of the plurality of second semiconductor chips, and the package molding layer has a second thickness that is greater than the first thickness in the second direction.

15. The semiconductor package of claim 14, wherein the package molding layer has a third thickness in the second direction from a side surface of the stacked structure group to one of the second edges, wherein the third thickness is greater than or equal to the second thickness.

16. The semiconductor package of claim 11, wherein the plurality of third semiconductor chips include a main semiconductor chip having a plurality of functional blocks and a chiplet having one functional block, wherein the main semiconductor chip is electrically connected to the chiplet through the interposer and is configured to function as one System on Chip (SoC).

17. The semiconductor package of claim 16, wherein the first chip group includes a dummy chip that is adjacent to one of the second edges, and a chiplet that is adjacent the other one of the second edges, wherein the second chip group includes a dummy chip that is adjacent to one of the second edges and a chiplet that is adjacent to the other one of the second edges, and wherein the dummy chip in each of the first chip group and the second chip group does not include a semiconductor device.

18. A semiconductor package comprising:

a package base substrate;

a silicon interposer attached to the package base substrate, the silicon interposer comprising a base layer and a plurality of through-electrodes penetrating the base layer, and having a pair of first edges opposite to each other in a first direction and a pair of second edges opposite to each other in a second direction orthogonal to the first direction;

a stacked structure group attached to the silicon interposer, the stacked structure group comprising a plurality of stacked structures, each stacked structure comprising a first semiconductor chip including a first semiconductor substrate and a plurality of first through-electrodes penetrating the first semiconductor substrate, a plurality of second semiconductor chips sequentially stacked on the first semiconductor chip and including a second semiconductor substrate and a plurality of second through-electrodes penetrating the second semiconductor substrate and electrically connected to the plurality of first through-electrodes, and a chip molding layer on an upper surface of the first semiconductor chip and a side surface of the plurality of second semiconductor chips;

a plurality of third semiconductor chips attached to the silicon interposer adjacent the stacked structure group; and a package molding layer on the silicon interposer, the package molding layer extending around the stacked structure group and the plurality of third semiconductor chips to form a molding interface with the chip molding layer, wherein the plurality of third semiconductor chips comprise a first chip group arranged in a row along one of the first edges, and a second chip group arranged in a row along the other one of the first edges, wherein the stacked structure group is spaced apart from each of the first edges, the chip molding layer has a first thickness in the second direction from a side surface of the plurality of second semiconductor chips toward one of the second edges, the package molding layer has a second thickness in the second direction between the side surface of the plurality of second semiconductor chips and the one of the second edges, and the second thickness is at least twice the first thickness, and a side surface of the stacked structure group adjacent to one of the second edges is not closer to the one of the second edges than a side surface of the third semiconductor chip adjacent to the one of the second edges.

19. The semiconductor package of claim 18, wherein the first semiconductor chip is an HBM control die, the second semiconductor chip is a DRAM die, and at least one of the plurality of third semiconductor chips has a plurality of functional blocks, and at least one of the plurality of third semiconductor chips has one functional block.

20. The semiconductor package of claim 18, wherein the first thickness is from about 150 μm to about 400 μm, and the second thickness is from about 500 μm to about 1000 μm.

* * * * *